United States Patent
Higuchi et al.

(10) Patent No.: US 9,664,243 B2
(45) Date of Patent: May 30, 2017

(54) GRIPPER MECHANISM AND MOVEMENT MECHANISM

(71) Applicants: Toshiro Higuchi, Tokyo-to (JP); Hiroyuki Nabae, Tokyo-to (JP); TOKYO WELD CO., LTD., Ota-ku, Tokyo-to (JP)

(72) Inventors: Toshiro Higuchi, Bunkyo-ku (JP); Hiroyuki Nabae, Bunkyo-ku (JP); Noritoshi Nakanishi, Ota-ku (JP)

(73) Assignees: Toshiro Higuchi, Tokyo-To (JP); Hiroyuki Nabae, Tokyo-To (JP); TOKYO WELD CO., LTD., Tokyo-To (JP)

(*) Notice: Subject to any disclaimer, the term of this patent is extended or adjusted under 35 U.S.C. 154(b) by 129 days.

(21) Appl. No.: 14/630,927

(22) Filed: Feb. 25, 2015

(65) Prior Publication Data
US 2015/0240889 A1  Aug. 27, 2015

(30) Foreign Application Priority Data
Feb. 26, 2014 (JP) .................................. 2014-035778

(51) Int. Cl.
*B60L 7/00* (2006.01)
*F16D 63/00* (2006.01)
(Continued)

(52) U.S. Cl.
CPC .............. *F16D 63/002* (2013.01); *B06B 1/04* (2013.01); *B25J 15/0246* (2013.01);
(Continued)

(58) Field of Classification Search
CPC H02K 1/34; H02K 7/14; H02N 2/043; H02N 2/023; F16D 63/002; G10K 9/13;
(Continued)

(56) References Cited

U.S. PATENT DOCUMENTS

| 4,845,688 A | 7/1989 | Butler |
| 4,894,811 A | 1/1990 | Porzio |

(Continued)

FOREIGN PATENT DOCUMENTS

| JP | 1-97582 A | 4/1989 |
| JP | 2004-925 A | 1/2004 |

(Continued)

OTHER PUBLICATIONS

Translation of Japanese Patent document 2006-211874 obtained from https://worldwide.espacenet.com/ on Nov. 8, 2016.*

(Continued)

*Primary Examiner* — Pamela Rodriguez
(74) *Attorney, Agent, or Firm* — Birch, Stewart, Kolasch & Birch, LLP

(57) ABSTRACT

A gripper mechanism and a movement mechanism which utilize an electromagnetic actuator which can secure a sufficient thrust force at least at a certain level over a wide range of displacement. The movement mechanism includes a pair of electromagnetic actuators disposed inside a pair of rails and an intermediate actuator provided between the electromagnetic actuators. The electromagnetic actuators function as a gripper mechanism to be gripped by the rails. The electromagnetic actuators each include a displacement amplification mechanism including a magnetic body, and coils provided in the displacement amplification mechanism. A magnetic flux is generated in the magnetic body by passing an electric current through the coils so as to displace the displacement amplification points of the displacement amplification mechanism.

13 Claims, 23 Drawing Sheets

(51) Int. Cl.
*H02K 1/34* (2006.01)
*H02K 7/14* (2006.01)
*H02N 2/04* (2006.01)
*B25J 15/02* (2006.01)
*H01F 7/08* (2006.01)
*H01F 7/16* (2006.01)
*H01L 41/12* (2006.01)
*H02N 2/02* (2006.01)
*B06B 1/04* (2006.01)

(52) U.S. Cl.
CPC ........... *H01F 7/081* (2013.01); *H01F 7/1638* (2013.01); *H01L 41/12* (2013.01); *H02K 1/34* (2013.01); *H02K 7/14* (2013.01); *H02N 2/023* (2013.01); *H02N 2/043* (2013.01)

(58) Field of Classification Search
CPC .... H01F 7/1638; H01F 7/081; B25J 15/0246; H01L 41/12; B06B 1/04
USPC ........ 188/164, 161, 165, 158; 335/220, 222, 335/227, 229; 105/77, 78
See application file for complete search history.

(56) References Cited

U.S. PATENT DOCUMENTS

| | | | |
|---|---|---|---|
| 5,281,875 A | 1/1994 | Kiesewetter et al. | |
| 5,718,418 A * | 2/1998 | Gugsch | H02K 33/16 188/267 |
| 5,739,610 A * | 4/1998 | Nemoto | F16D 55/2245 188/158 |
| 6,169,342 B1 * | 1/2001 | Schmillen | F01L 9/04 310/12.24 |
| 6,777,895 B2 * | 8/2004 | Shimoda | H02K 33/16 318/114 |
| 7,288,861 B1 * | 10/2007 | Willard | H02K 41/0356 310/14 |
| 9,281,111 B2 * | 3/2016 | Higuchi | H01F 7/081 |
| 2002/0150325 A1 | 10/2002 | Noda | |
| 2004/0257912 A1 | 12/2004 | Dubinsky et al. | |
| 2015/0240894 A1 * | 8/2015 | Piech | F16D 63/008 188/163 |

FOREIGN PATENT DOCUMENTS

| | | |
|---|---|---|
| JP | 2006-211874 A | 8/2006 |
| WO | WO 2013/072811 A1 | 5/2013 |

OTHER PUBLICATIONS

European Search Report issued in related application No. EP 15000272.3 on Aug. 5, 2015 (in English).

\* cited by examiner

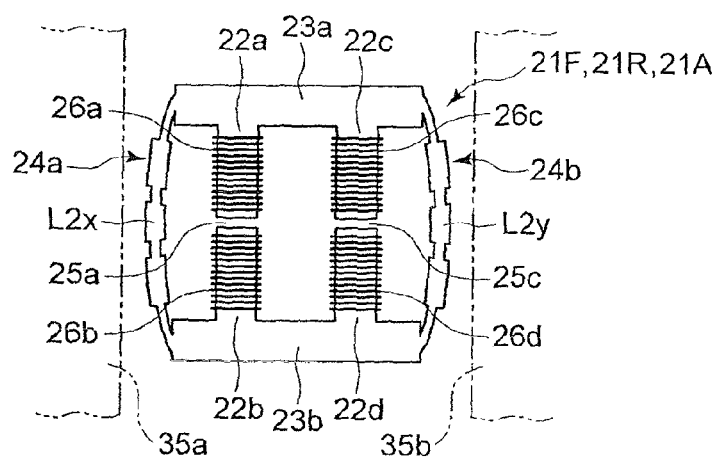
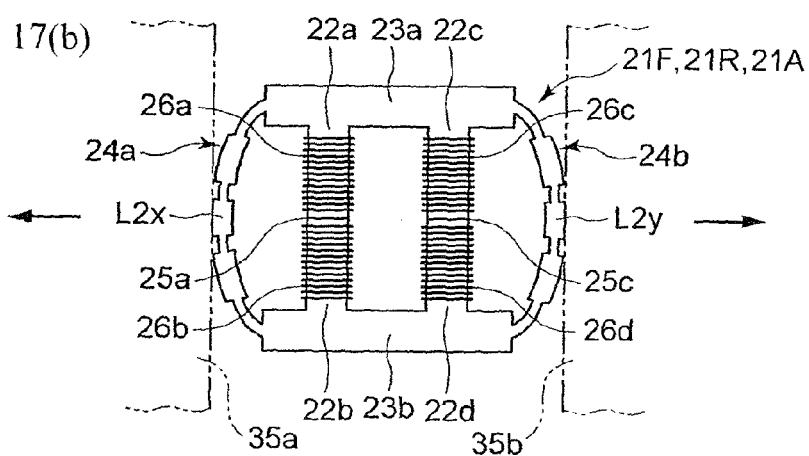
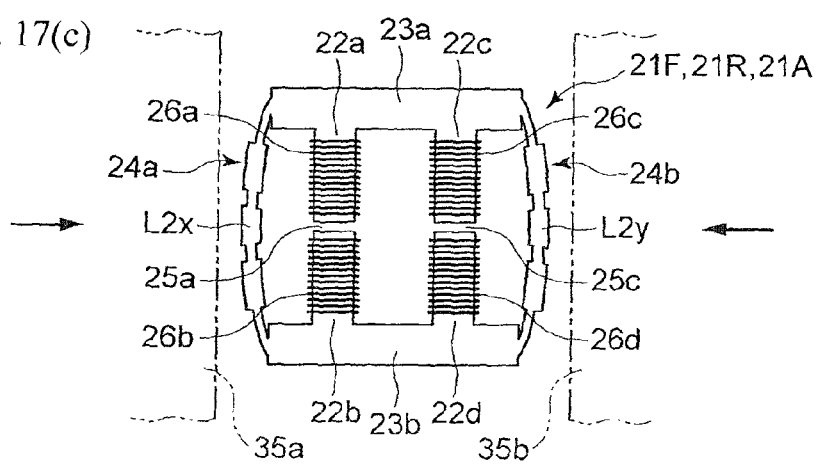

GRIPPER MECHANISM AND MOVEMENT MECHANISM

CROSS-REFERENCE TO RELATED APPLICATION

This application claims the priority benefit of Japanese Patent Application No. 2014-35778, filed on Feb. 26, 2014, the disclosure of which is incorporated herein by reference in its entirety.

TECHNICAL FIELD

The present invention relates to a gripper mechanism and a movement mechanism, each comprising an electromagnetic actuator including a displacement amplification mechanism, and more particularly to a gripper mechanism and a movement mechanism, each comprising an electromagnetic actuator which can secure a sufficient thrust force at least at a certain level over a wide range of displacement and which can reduce the overall size of the device.

BACKGROUND ART

Electromagnetic actuators using an electromagnetic attraction force are known in the prior art. FIGS. 29(a) through 29(c) show a prior-art electromagnetic attraction force generation mechanism constituting an electromagnetic actuator. FIG. 29(a) is a front view of the electromagnetic attraction force generation mechanism 101. The electromagnetic attraction force generation mechanism 101 is comprised of a magnetic body, such as iron, having a generally-rectangular cross-section. In particular, the electromagnetic attraction force generation mechanism 101 includes a pair of attracting iron cores 102a, 102b, extending in approximately the same direction, and a magnetic force generating iron core 103 connecting the ends of the attracting iron cores 102a, 102b, and thus has the shape of the letter "U".

Wiring 104, composed of a linear conductive material such as a copper wire, is wound around the magnetic force generating iron core 103. The other ends of the attracting iron cores 102a, 102b are flat attracting surfaces 102as, 102bs. FIG. 29(b) shows the electromagnetic attraction force generation mechanism 101 of FIG. 29(a) as viewed in the direction of arrow A101, and FIG. 29(c) shows the electromagnetic attraction force generation mechanism 101 of FIG. 29(a) as viewed in the direction of arrow B101. The wiring 104 is omitted in FIGS. 29(b) and 29(c). As shown in FIGS. 29(b) and 29(c), the cross-sectional area of each of the attracting iron cores 102a, 102b is approximately the same as the cross-sectional area of the magnetic force generating iron core 103.

FIG. 30 shows an electromagnetic actuator 111 using the electromagnetic attraction force generation mechanism 101. In the electromagnetic actuator 111, the attracting surfaces 102as, 102bs of the electromagnetic attraction force generation mechanism 101 are held approximately vertical by means of a not-shown holding mechanism. A movable iron piece 106 is disposed in a position opposite the attracting surfaces 102as, 102bs of the electromagnetic attraction force generation mechanism 101 with a slight gap 105 between them, as shown by the solid lines. The length of the gap 105 between one surface 106s1 of the movable iron piece 106 in that position and the attracting surfaces 102as, 102bs is x101.

The opposite surface 106s2 of the movable iron piece 106 is connected via a wire 107a to one end of a spring 108, and the other end of the spring 108 is connected via a wire 107b to a wall surface 109. The surfaces 106s1, 106s2 of the movable iron piece 106 are approximately vertical; the attracting surfaces 102as, 102bs of the electromagnetic attraction force generation mechanism 101 are approximately parallel to the opposing surface 106s1 of the movable iron piece 106.

The operation of the electromagnetic actuator 111 will now be described with reference to FIG. 30. When a voltage is applied to the wiring 104, an electric current is supplied to the siring 104 and a magnetic flux is generated and increased in the flowing magnetic circuit: magnetic force generating iron core 103→attracting iron core 102a→gap 105→movable iron piece 106→gap 105→attracting iron core 102b→magnetic force generating iron core 103. Accordingly, an attraction force is generated and is applied from the attracting surfaces 102as, 102bs to the surface 106s1 of the movable iron piece 106 via the gap 105. Therefore, the spring 108 extends and the movable iron piece 106 is displaced toward the attracting surfaces 102as, 102bs, and the surface 106s1 is attracted and attached to the attracting surfaces 102as, 102bs, as shown by the broken lines in FIG. 30. Thus, the length of the gap 105 becomes substantially zero.

The movable iron piece 106 moves while maintaining the approximately vertical position by means of a guide or a parallel spring as a guide, both not shown. The surface 106s1 of the movable iron piece 106 can therefore be kept parallel to the attracting surfaces 102as, 102bs of the electromagnetic attraction force generation mechanism 101 during the movement of the movable iron piece 106.

When the voltage applied to the wiring 104 is shut off, the electric current disappears, whereby the magnetic flux in the magnetic circuit decreases. Due to the biasing force of the spring 108, the surface 106s1 of the movable iron piece 106 moves away from the attracting surfaces 102as, 102bs and returns to the position shown by the solid lines in FIG. 30, i.e. the position where the length of the gap 105 between the surface 106s1 and the attracting surfaces 102as, 102bs is x101. Thus, the displacement produced in the movable iron piece 106 by means of the electromagnetic attraction force generation mechanism 101 is x101.

Such electromagnetic actuator 111 has the following problems: FIG. 31 is a graph showing the relationship between displacement and thrust force in the electromagnetic actuator 111, as observed when a constant electric current is supplied to the wiring 104. In FIG. 31, the abscissa represents the displacement x101, and the ordinate represents the attraction force, i.e. the thrust force, applied from the electromagnetic attraction force generation mechanism 101 to the movable iron piece 106 when the displacement is produced. As can be seen in FIG. 31, though the thrust force is sufficiently high when the displacement is small, the thrust force drastically decreases as the displacement increases.

Thus, the attraction force, i.e. the thrust force, applied from the electromagnetic attraction force generation mechanism 101 to the movable iron piece 106 is significantly low when the length of the gap 105 (displacement) x101, shown in FIG. 30, is large as compared to the case where the displacement x101 is small; the thrust force applied to the movable iron piece 106 is very low when the movable iron piece 106 lies in a position farthest from the attracting surfaces 102as, 102bs of the electromagnetic attraction force generation mechanism 101.

When it is intended to produce some effect, e.g. the generation of vibration, by using the thrust force, only a very low vibration force can be obtained when the thrust force is very low. Thus, in order to obtain a sufficiently high thrust force in the prior-art electromagnetic actuator 111, the displacement must be limited to a very small value range. To obtain a sufficiently high thrust force with the use of a large displacement, it is necessary to supply a high electric current to the wiring 104 of the electromagnetic attraction force generation mechanism 101. This requires the use of an electronic part(s), which is adapted for high electric current, in a current supply circuit for the wiring 104, leading to an increase in the cost or size of the circuit. In addition, because of non-integration of the electromagnetic actuator 111 as a whole, parts such as the electromagnetic attraction force generation mechanism 101, the movable iron piece 106, the wires 107a, 107b and the spring 108 are produced separately and thereafter assembled. This requires a complicated process for the production of the electromagnetic actuator 111.

SUMMARY OF THE INVENTION

A demand therefore exists for an electromagnetic actuator which makes it possible to reduce a drastic decrease in the thrust force with increase in the displacement, to reduce the range of change in the thrust force even when the displacement changes over a wide range, and to reduce the overall size of the actuator, thereby enabling easier production of the actuator. A demand also exists for the development of a gripper mechanism and a movement mechanism which utilize such an electromagnetic actuator.

The present invention has been made in view of the above situation. It is therefore an object of the present invention to provide a gripper mechanism and a movement mechanism which utilize an electromagnetic actuator which can reduce a drastic decrease in the thrust force with increase in the displacement, and can reduce the range of change in the thrust force even when the displacement changes over a wide range.

In order to achieve the object, the present invention provides a gripper mechanism comprising an electromagnetic actuator provided in a guide, said electromagnetic actuator comprising a displacement amplification mechanism including a magnetic body having at least one displacement amplification point and a thrust generating portion, and a coil, provided in the displacement amplification mechanism, for generating a magnetic flux in the magnetic body, wherein a magnetic flux is generated in the magnetic body by passing an electric current through the coil, thereby generating a thrust force in the thrust generating portion, and the displacement amplification point is displaced by the thrust force so that the displacement amplification point is brought into contact with or separated from the guide.

In a preferred embodiment of the present invention, the electromagnetic actuator has at least two displacement amplification points disposed at opposing positions in the displacement amplification mechanism.

In a preferred embodiment of the present invention, the guide at least has opposing inner surfaces and the electromagnetic actuator is disposed between the inner surfaces of the guide; and the displacement amplification point or points of the electromagnetic actuator come into contact with or separate from the inner surfaces.

In a preferred embodiment of the present invention, the guide has at least one guide rod and the electromagnetic actuator is mounted on the periphery of the guide rod; and the displacement amplification point or points of the electromagnetic actuator come into contact with or separate from the periphery of the guide rod.

The present invention also provides a movement mechanism comprising a pair of electromagnetic actuators provided in a guide, and an intermediate actuator which is secured to the pair of electromagnetic actuators and which expands/contracts along the guide, said electromagnetic actuators each comprising a displacement amplification mechanism including a magnetic body having at least one displacement amplification point and a thrust generating portion, and a coil, provided in the displacement amplification mechanism, for generating a magnetic flux in the magnetic body, wherein a magnetic flux is generated in the magnetic body by passing an electric current through the coil, thereby generating a thrust force in the thrust generating portion, and the displacement amplification point is displaced by the thrust force so that the displacement amplification point is brought into contact with or separated from the guide.

In a preferred embodiment of the present invention, each electromagnetic actuator has at least two displacement amplification points disposed at opposing positions in the displacement amplification mechanism.

In a preferred embodiment of the present invention, the guide at least has opposing inner surfaces and the electromagnetic actuators are disposed between the inner surfaces of the guide; and the displacement amplification point or points of each electromagnetic actuator come into contact with or separate from the inner surfaces.

In a preferred embodiment of the present invention, the guide has at least one guide rod and the electromagnetic actuators are mounted on the periphery of the guide rod; and the displacement amplification point or points of each electromagnetic actuator come into contact with or separate from the periphery of the guide rod.

In a preferred embodiment of the present invention, the intermediate actuator has the same structure as each of the electromagnetic actuators.

In a preferred embodiment of the present invention, the intermediate actuator has the same structure as each of the electromagnetic actuators, and the electromagnetic actuators and the intermediate actuator take a position facing the same direction.

In a preferred embodiment of the present invention, the intermediate actuator is a small displacement actuator including a piezoelectric actuator or a magnetostrictive actuator.

As described above, according to the present invention, there are provided a gripper mechanism and a movement mechanism which utilize an electromagnetic actuator which can reduce a drastic decrease in the thrust force with increase in the displacement, and can reduce the range of change in the thrust force even when the displacement changes over a wide range.

BRIEF DESCRIPTION OF THE DRAWINGS

FIGS. 17(a) through 17(c) are diagrams showing an electromagnetic actuator of a gripper mechanism according to an embodiment of the present invention;

DETAILED DESCRIPTION OF THE PREFERRED EMBODIMENTS

A gripper mechanism and a movement mechanism according to the present invention, each including an electromagnetic actuator, will now be described.

An electromagnetic actuator for use in a gripper mechanism and a movement mechanism according to the present invention will be described first.

<First Embodiment of Electromagnetic Actuator>

Preferred embodiments of the instant electromagnetic actuator will now be described with reference to the drawings.

FIGS. 1 through 10 are diagrams illustrating a first embodiment of the instant electromagnetic actuator.

At the outset, the basic principle of the present invention will be described with reference to a model of a magnetic circuit and its displacement-thrust force characteristics.

Figure 1A:
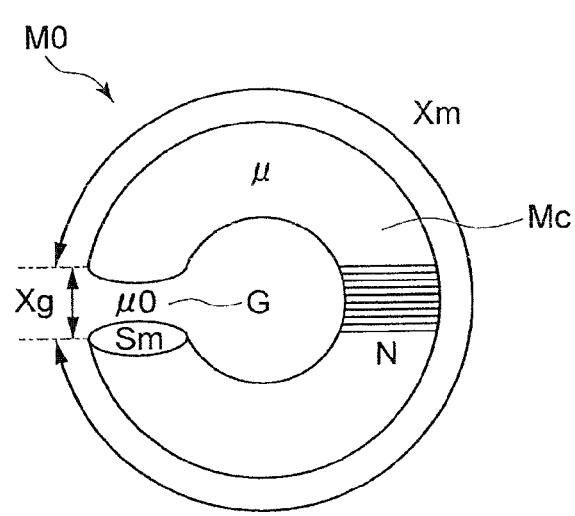
FIGS. 1(a) and 1(b) are diagrams showing a model of a magnetic circuit.
Figure 1B:
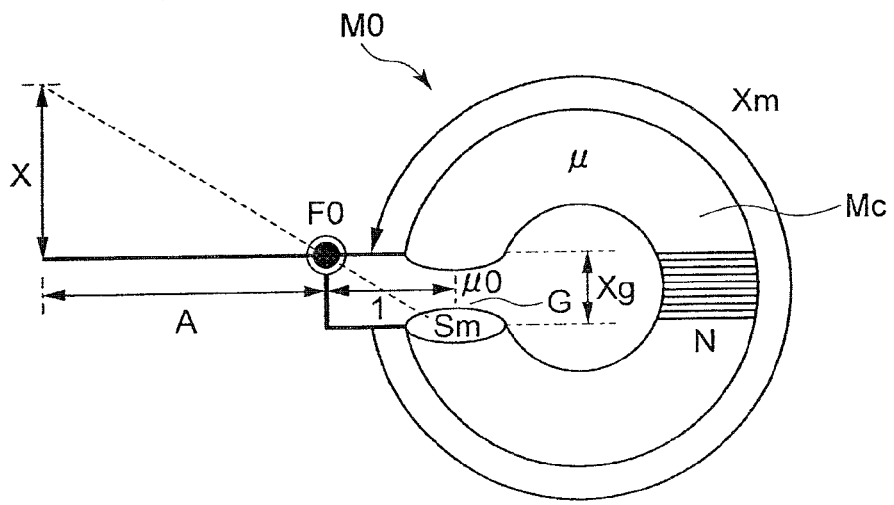

FIGS. 1(a) and 1(b) are diagrams showing a model of a magnetic circuit; FIG. 1(a) shows the magnetic circuit model, and FIG. 1(b) shows a model in which a displacement amplification mechanism is added to the magnetic circuit. The illustrated magnetic body Mc has the shape of an open ring having a length Xm and a cross-sectional area Sm, and having a gap G with a length Xg.

Figure 2:
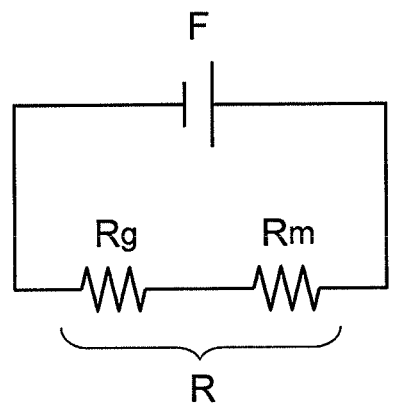
FIG. 2 is a diagram showing an electrical circuit substituted for the magnetic circuit of FIG. 1.

Wiring (coil) of conductive material, whose number of turns is N, is wound around the magnetic body Mc. When a voltage V is applied to both ends of the wiring, an electric current I is supplied to the wiring, whereby the magnetic body Mc becomes magnetized. The magnetic body Mc and the gap G form a magnetic circuit M0. FIG. 2 shows an electrical circuit substituted for the magnetic circuit M0 of FIG. 1(a). In the electrical circuit, the reluctance Rm of the magnetic body Mc and the reluctance Rg of the gap G are connected in series, with a magnetic potential difference F being applied to the circuit.

The combined reluctance R of the series-connected reluctances Rm and Rg can be determined by the following equation:

$$R = Rm + Rg = Xm/Sm\mu + Xg/Sm\mu 0 \quad (1)$$

where $\mu$ is the magnetic permeability of the magnetic body Mc, and $\mu 0$ is the magnetic permeability of the gap G (the magnetic permeability of air).

The magnetic flux $\Phi$ can be determined by dividing the magnetic potential difference F by the reluctance R:

$$\Phi = F/R = F/(Rm+Rg) = NISm/(Xm/\mu + Xg/\mu 0) \quad (2)$$

where N is the number of turns of the wiring, and I is the electric current.

The following relation is used in the above calculation (2):

$$F = NI \quad (3)$$

Next, the attraction force, i.e. the thrust force Fg, acting between the opposing surfaces on both sides of the gap G by the action of the magnetic circuit M0 in FIG. 1, is determined. The wiring wound around the magnetic body Mc acts as an inductor. The magnetic energy Um stored in the wiring (inductor), i.e. the work performed by a power source, is determined. The voltage V of the power source, the electric current I flowing in the wiring and the inductance L of the wiring satisfy the following equation:

$$Um = \int_0^1 IV dt \quad (4)$$

$$= \int_0^1 I L dI/dt \cdot dt \quad (\because V = L dI/dt)$$

$$= \int_0^1 L dI$$

$$= LI^2/2$$

$V = Nd\Phi/dt$, i.e., $LdI/dt = Nd\Phi/dt$ therefore $LI = N\Phi$

The equation (4) can therefore be transformed to:

$$Um = Nd\Phi/2 \quad (5)$$

The magnetic potential difference F and the reluctance R satisfy the following relation:

$$F = NI = \Phi R \quad (6)$$

Therefore, using the equation (6), the equation (5) can be transformed to:

$$Um = \Phi F/2 \quad (7)$$
$$= \Phi^2 R/2$$

A change in the magnetic energy corresponds to a mechanical work performed to or from the outside.

Consider now a work in an X direction which coincides with the direction of the length Xg of the gap G, shown in FIG. 1.

The mechanical energy Ud can be expressed as follows:

$$Ud = \int_0^x Fx\,dx$$

The force produced by a change in the energy can therefore be expressed as follows:

$$Fx = dUd/dx \quad (8)$$

Since a change in Ud corresponds to a change in Um, the equation (8) can be transformed to:

$$Fx = \frac{dUm}{dx} \quad (9)$$
$$= \frac{d}{dx} \cdot \Phi^2 R/2 \quad (\because \text{equation (7)})$$
$$= \Phi^2/2 \cdot dR/dx$$
$$= \Phi^2/2 \cdot d/dx \cdot (Xm/Sm\mu + Xg/Sm\mu 0) \quad (\because \text{equation (1)})$$
$$= \Phi^2/2\mu 0 Sm$$

The force thus determined is the attraction force, i.e. the thrust force, acting between the opposing surfaces on both sides of the gap G. The equation (9) can be transformed by applying the equation (6) and the equation (1) to the equation (9) as follows:

$$Fx = \Phi^2/2\mu 0 Sm \quad (10)$$
$$= N^2 I^2 2\mu 0 Sm R^2$$
$$= N^2 I^2 Sm\mu 0/2(\mu 0/\mu \cdot Xm + Xg)^2$$
$$= \alpha I^2/(\overline{X} + Xg)^2$$

where $\alpha = N^2 Sm\mu 0/2$ $$\overline{X} = \mu 0/\mu \cdot Xm$$

The equation (10) shows the relationship between the length of the gap G, i.e. the displacement Xg, and the thrust force Fx; the thrust force Fx is inversely proportional to the square of the displacement Xg. Consider now adding a displacement amplification mechanism, which utilizes the principle of leverage and is an essential feature of the present invention, to the magnetic circuit of FIG. 1. Thus, as shown in FIG. 1(*b*), the displacement Xg is amplified by A times into X with a point F0 as a fulcrum. Accordingly, A-times displacement amplification (displacement amplification ratio is A) is made to the equation (10) that shows the relationship between the displacement Xg and the thrust force Fx. By the amplification of the displacement, the displacement Xg in the equation (10) is replaced by the A-times amplified displacement (the displacement X shown in FIG. 1(*b*)), and the thrust force Fx in the equation (10) is replaced by a thrust force which is reduced to 1/A of the thrust force at the length Xg of the gap G before the displacement amplification. Taking into consideration the amplification of the displacement and the reduction of the thrust force made by the displacement amplification mechanism, the equation (10) can be rewritten to define the thrust force FA after the displacement amplification in the following manner: The A-times amplified displacement X is to be regarded as the displacement Xg in the equation (10). Accordingly, in order to convert the displacement Xg into the value before the displacement amplification, the displacement Xg is made 1/A in the equation (10) and, in addition, the thrust force Fx at the displacement before the displacement amplification is made 1/A. Thus, the thrust force FA after the displacement amplification can be expressed by the following equation:

$$FA = \alpha I^2 / A(\overline{X} + Xg/A)^2 \quad (11)$$
$$= A\alpha I^2 / (A\overline{X} + Xg)^2$$

Comparison will now be made between the thrust force Fx and the thrust force FA in terms of the relationship with the displacement Xg at a constant electric current I.

Figure 3:
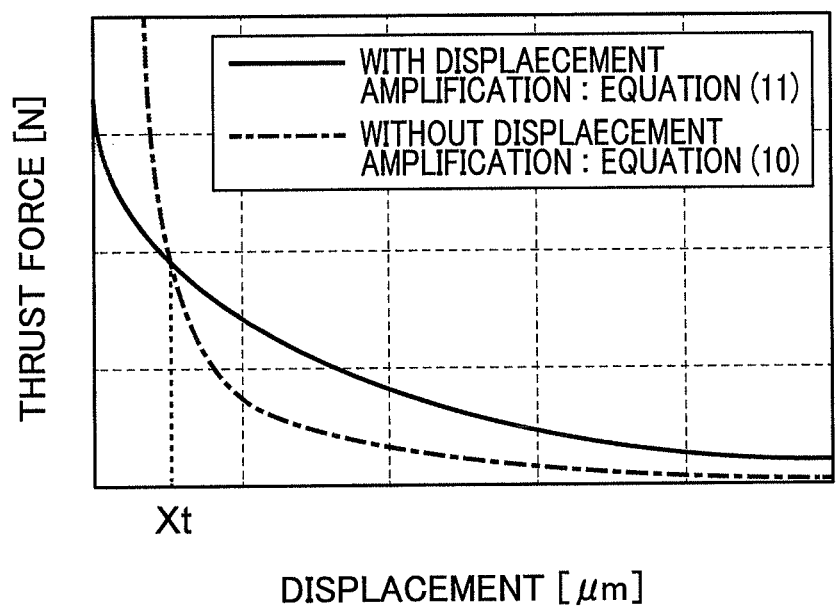
FIG. 3 is a graph showing the relationship between displacement and thrust force in the magnetic circuit of FIG. 1.

As described above, the equation (10) expresses the relationship between the displacement Xg and the thrust force Fx when no displacement amplification is made, while the equation (11) expresses the relationship between the displacement Xg and the thrust force FA when the displacement amplification is made. FIG. 3 shows the equations (10) and (11) in graph form, with the abscissa representing the displacement and the ordinate representing the thrust force.

In FIG. 3, the dashed-dotted line represents the equation (10) and the solid line represents the equation (11). The thrust force with the displacement amplification is larger than the thrust force without the displacement amplification when the displacement is higher than a certain value Xt. Conversely, the thrust force with the displacement amplification is smaller than the thrust force without the displacement amplification when the displacement is lower than the value Xt.

The dashed-dotted line graph of FIG. 3 is similar to the graph of FIG. 22 which shows the relationship between displacement and thrust force in the electromagnetic actuator 111 in which no displacement amplification is made.

As can be seen in FIG. 3, the thrust force at the same displacement becomes larger in the range of displacement higher than Xt by making the displacement amplification, whereas the thrust force at the same displacement becomes smaller in the range of displacement lower than Xt by making the displacement amplification. This means that by making the displacement amplification, a drastic decrease in the thrust force in a displacement range higher than Xt is reduced and the range of change in the thrust force is reduced over a wide range of distribution. It therefore becomes possible to secure a sufficient thrust force at least at a certain level over a wide displacement range which is intended to be used.

It is noted in this regard that as described above, in the relationship between the length of the gap G, i.e. the displacement Xg, and the thrust force Fx, the thrust force Fx is inversely proportional to the square of the displacement Xg. Thus, if no displacement amplification is made to the electromagnetic actuator, the thrust force Fx greatly increases with decrease in the displacement Xg and greatly decreases with increase in the displacement Xg.

In this embodiment the displacement Xg is increased by A times and the thrust force Fx is decreased to 1/A by making the A-times displacement amplification to the magnetic actuator, whereby the graph showing the relationship between the displacement Xg and the thrust force Fx becomes flatter as shown in FIG. 3.

The above description of the relationship between the displacement and the thrust force is based on the assumption of the same electric current. In electromagnetism, thrust force increases in a simple manner with increase in electric current supplied. Thus, to reduce a decrease in the thrust force in a displacement range higher than Xt, i.e. to obtain a larger thrust force at the same electric current, means that the same thrust force can be obtained at a lower electric current when the displacement is larger than Xt.

This also means that when it is intended to obtain a sufficient thrust force in a displacement range which is higher than a certain displacement, it is not necessary to use an electronic part(s), which is adapted for high electric current, in a current supply circuit, making it possible to avoid an increase in the cost or size of the circuit.

The first embodiment of the present invention, which adds a displacement amplification mechanism to a magnetic circuit as shown in FIG. 1 based on the above-described principle, i.e. an electromagnetic actuator according to the present invention which comprises the combination of the magnetic circuit and the displacement amplification mechanism, will now be described with reference to FIGS. 4(a) through 4(c) and FIG. 5.

Figure 4A:
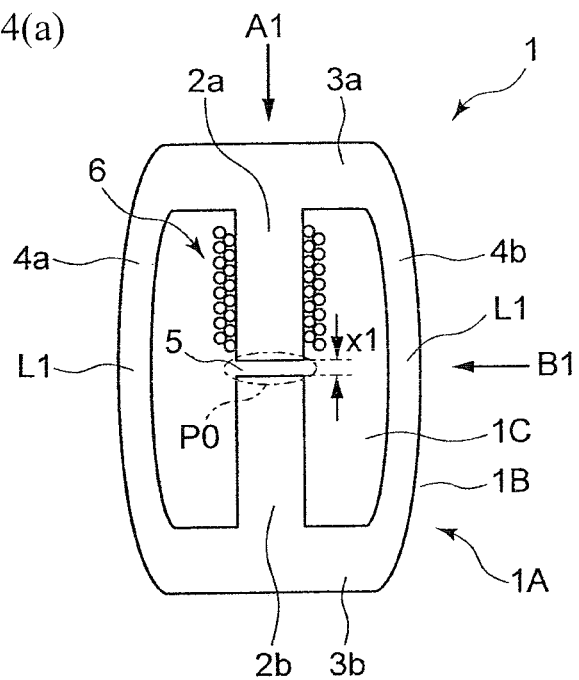
FIGS. 4(a) through 4(c) are diagrams showing an electromagnetic actuator according to a first embodiment of the present invention.
Figure 4B:
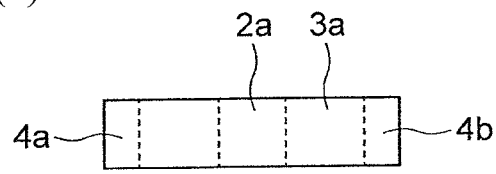
Figure 4C:
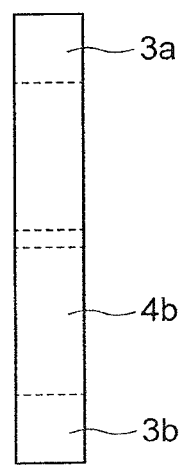
Figure 5:
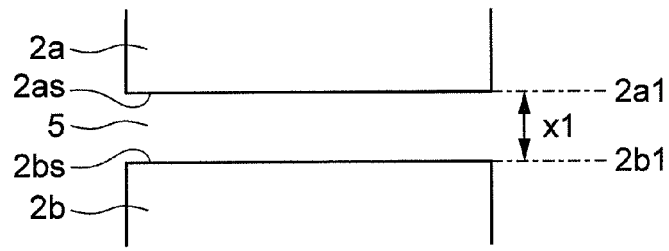
FIG. 5 is an enlarged view of the area P0 of FIG. 4(a)

FIG. 4(a) is a front view of an electromagnetic actuator, FIG. 4(b) shows the electromagnetic actuator of FIG. 4(a) as viewed in the direction of arrow A1, and FIG. 4(c) shows the electromagnetic actuator of FIG. 4(a) as viewed in the direction of arrow B1. FIG. 5 is an enlarged view of the area P0 of FIG. 4(a).

As shown in FIGS. 4(a) through 4(c) and FIG. 5, the electromagnetic actuator 1 has a point L1 of displacement (point of load) as will be described later. The electromagnetic actuator 1 includes a displacement amplification mechanism 1A made of a magnetic material, having a quadrangular cross-section and having two opposing surfaces 2as, 2bs which form a gap 5 between them, and a coil (wiring) 6 provided in the displacement amplification mechanism 1A and which generates a magnetic flux in the displacement amplification mechanism 1A. By passing an electric current through the coil 6, a magnetic flux is generated in the displacement amplification mechanism 1A to cause a change in the length x1 of the gap (thrust portion) 5 between the surfaces 2as, 2bs, thereby displacing the point L1 of displacement.

Though the illustrated displacement amplification mechanism 1A has a quadrangular cross-section, it is possible to use a displacement amplification mechanism 1A having a circular cross-section or a cross-section of another polygonal shape, such as a pentagonal or hexagonal cross-section.

The displacement amplification mechanism 1A will now be described. The displacement amplification mechanism 1A includes a pair of support iron cores 3a, 3b comprised of elastic members, a pair of movable iron cores 4a, 4b comprised of elastic members and located on both sides of the pair of support iron cores 3a, 3b, and a pair of attracting iron cores 2a, 2b extending inwardly from the support iron cores 3a, 3b and having the two opposing surfaces 2as, 2bs which form the gap 5. The support iron cores 3a, 3b and the movable iron cores 4a, 4b constitute an annular portion 1B, and the attracting iron cores 2a, 2b constitute a pair of displacement portions 1C.

The constituent members of the displacement amplification mechanism 1A will now be described in further detail. A middle portion of the support iron core 3a is connected to one end of the attracting iron core 2a; the support iron core 3a and the attracting iron core 2a form a T-shaped portion. Similarly, a middle portion of the support iron core 3b, having the same shape as the support iron core 3a, is connected to one end of the attracting iron core 2b having the same shape as the attracting iron core 2a; the support iron core 3b and the attracting iron core 2b form a T-shaped portion. The surface of the other end of the attracting iron core 2a faces the surface of the other end of the attracting iron core 2b. The movable iron cores 4a, 4b are connected to the opposite ends of the support iron cores 3a and 3b.

The movable iron cores 4a, 4b are slightly convex curved outward, i.e. in a direction away from the attracting iron cores 2a, 2b.

As described above, the support iron cores 3a, 3b and the movable iron cores 4a, 4b constitute the annular portion 1B. Further, as described above, the two opposing surfaces 2as, 2bs of the attracting iron cores 2a, 2b form the slight gap 5 with the length x1. The wiring 6, composed of a linear conductive material such as a copper wire, is wound around the attracting iron core 2a.

The wiring 6 is omitted in FIGS. 4(b) and 4(c). As shown in FIGS. 4(b) and 4(c), the cross-sectional area of each of the attracting iron cores 2a, 2b is approximately the same as the cross-sectional area of each of the support iron cores 3a, 3b. The cross-sectional area of each of the movable iron cores 4a, 4b is approximately 1/2 of the cross-sectional area of each of the attracting iron cores 2a, 2b. As shown in FIG. 5 which is an enlarged view of the area P0 of FIG. 4(a), the gap 5 is formed between the opposing surfaces 2as, 2bs, lying at positions 2a1, 2b1, of the attracting iron cores 2a, 2b, with the distance between the positions 2a1, 2b1 being x1.

The operation of the electromagnetic actuator of this embodiment, having the above-described construction, will now be described with reference to FIGS. 6 and 7.

Figure 6:
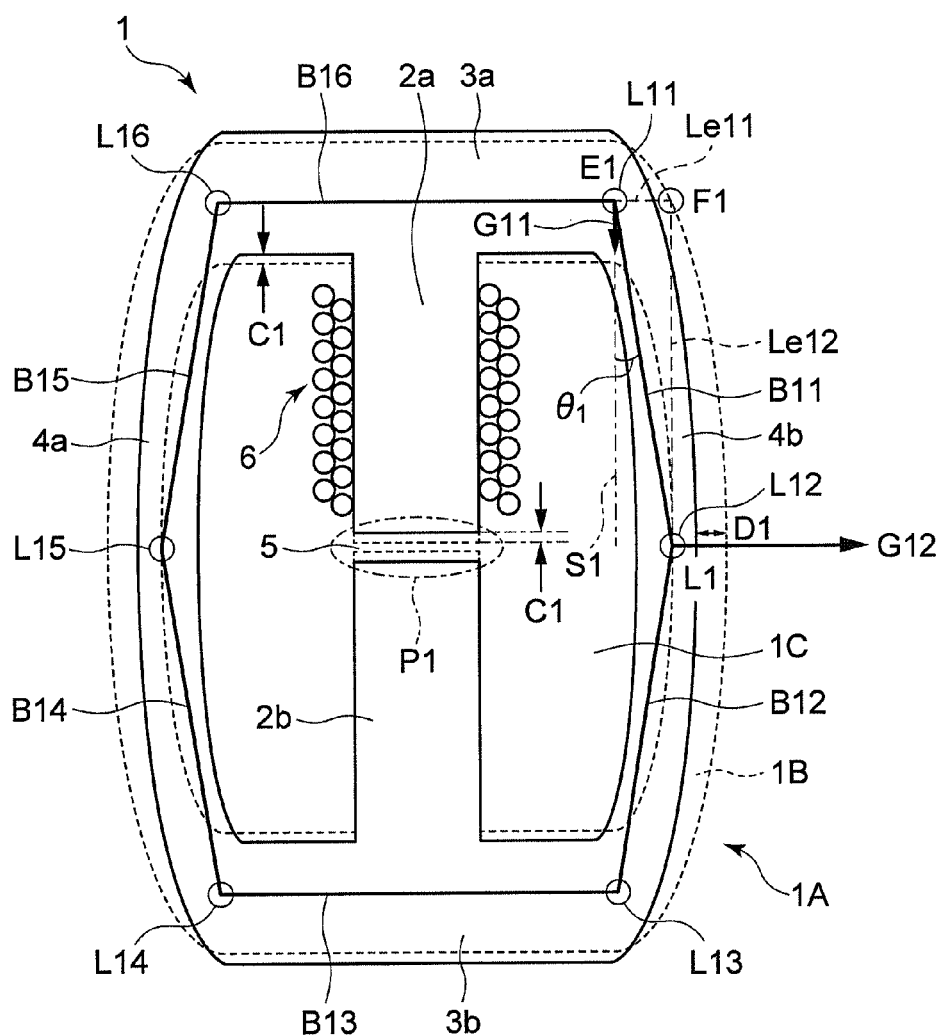
FIG. 6 is an enlarged view of the electromagnetic actuator of FIG. 4(a)

FIG. 6 is an enlarged view of the electromagnetic actuator of FIG. 4(a). An electric current is supplied to the coil (wiring) 6 when a voltage is applied to it by connecting a not-shown power source to both ends of the coil (wiring) 6. Upon the supply of electric current, a first magnetic circuit is formed through which a magnetic flux passes as follows: attracting iron core 2a→support iron core 3a→movable iron core 4a→support iron core 3b→attracting iron core 2b→gap 5→attracting iron core 2a. In addition, a second magnetic circuit is formed through which a magnetic flux passes as follows: attracting iron core 2a→support iron core 3a→movable iron core 4b→support iron core 3b→attracting iron core 2b→gap 5→attracting iron core 2a. The magnetic flux in the first and second magnetic circuits increases by the supply of electric current.

The displacement amplification mechanism 1A thus forms the magnetic circuits including the support iron cores 3a, 3b and the movable iron cores 4a, 4b and through which a magnetic flux passes. The magnetic circuits include the gap 5 formed between the surfaces 2as, 2bs of the attracting iron cores 2a, 2b of magnetic material as shown in FIG. 5. Therefore, an attraction force (thrust force) is generated between the surfaces 2as, 2bs through the gap (thrust portion) 5. Because the support iron cores 3a, 3b and the movable iron cores 4a, 4b are comprised of elastic members, the attraction force generated between the opposing surfaces 2as, 2bs of the attracting iron cores 2a, 2b causes the surfaces 2as, 2bs to move closer to each other. The movement is illustrated in FIG. 7 which is an enlarged view of the area P1 of FIG. 6.

Figure 7:
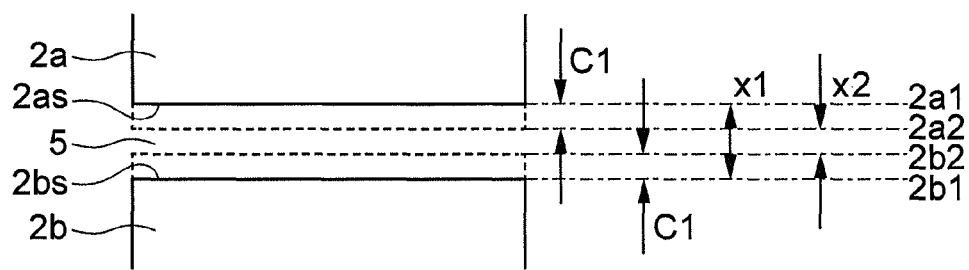
FIG. 7 is an enlarged view of the area P1 of FIG. 6.

When no electric current is flowing in the wiring 6 in FIG. 6, the positions of the opposing surfaces 2as, 2bs of the attracting iron cores 2a, 2b are 2a1 and 2b1, respectively, in FIG. 7 and the distance between them is x1 as in FIG. 5. This is illustrated by the solid lines in FIG. 7.

As described above, when an electric current flows in the wiring 6 in FIG. 6, an attraction force acts between the opposing surfaces 2as, 2bs of the attracting iron cores 2a, 2b, whereby the position of the surface 2as and the position of the surface 2bs come closer to 2a2 and 2b2, respectively, and the gap 5 becomes narrower; the distance between the surfaces 2as, 2bs becomes x2 as shown by the broken lines in FIG. 7. Thus, by supplying the electric current to the wiring 6, a displacement C1 is produced in each of the surfaces 2as, 2bs as shown in FIG. 7.

When the application of voltage to the wiring 6 is shut off, the magnetic flux in the above-described magnetic circuits decreases and the attraction force, acting between the surfaces 2as, 2bs, disappears. Because the support iron cores 3a, 3b and the movable iron cores 4a, 4b are comprised of elastic members, the opposing surfaces 2as, 2bs of the attracting iron cores 2a, 2b return to the positions 2a1, 2b1, respectively.

Thus, the gap 5 returns to the state as observed when there is no electric current flowing in the wiring 6, i.e. when there is no generation of magnetic flux; the distance between the surfaces 2as, 2bs becomes x1.

As described above, a displacement C1 is produced in each of the opposing surfaces 2as, 2bs of the attracting iron cores 2a, 2b in the electromagnetic actuator 1.

The displacement C1, produced in each of the opposing surfaces 2as, 2bs of the attracting iron cores 2a, 2b, is illustrated also in the area P1 of FIG. 6.

In this embodiment the attracting iron cores 2a, 2b thus return to the original positions via the support iron cores 3a, 3b and the movable iron cores 4a. 4b, constituting the displacement amplification mechanism 1A. Therefore, there is no need to separately provide an elastic body in order to return the attracting iron cores 2a, 2b to the original positions, making it possible to reduce the overall size and the cost of the displacement amplification mechanism 1A.

The mechanism of amplification of the displacement C1 will now be described with reference to FIG. 6.

The displacement C1 in each of the opposing surfaces 2as, 2bs of the attracting iron cores 2a, 2b in the area P1, shown by the broken lines in FIG. 6, is produced at the opposing ends of the attracting iron cores 2a, 2b. Therefore, the same displacement C1 in the same direction is produced also in the support iron cores 3a, 3b whose middle portions are connected to the other ends of the attracting iron cores 2a, 2b. This is illustrated in FIG. 6 in the portion of the support iron core 3a by the broken lines and the symbol C1, indicating the same displacement as in the attracting iron core 2a. The displacement C1 of the support iron core 3a is amplified by the support iron core 3a and by the movable iron cores 4a, 4b connected to both ends of the support iron core 3a. The support iron core 3a and the support iron core 3b are disposed vertically symmetrically. Thus, the support iron cores 3a, 3b and the movable iron cores 4a, 4b as a whole constitute a link mechanism for displacement amplification.

The principle will now be described with reference to a link mechanism as applied to the support iron cores 3a, 3b and the movable iron cores 4a, 4b, constituting the displacement amplification mechanism 1A. The link mechanism has six link connection points: a connection point L11 between the support iron core 3a and the movable iron core 4b; a midpoint L12 of the movable iron core 4b; a connection point L13 between the movable iron core 4b and the support iron core 3b; a connection point L14 between the support iron core 3b and the movable iron core 4a; a midpoint L15 of the movable iron core 4a; and a connection point L16 between the movable iron core 4a and the support iron core 3a. The link connection points L11, L12, L13, L14, L15 and L16 are disposed clockwise in this order. As shown in FIG. 6, bars B11, B12, B13, B14, B15 and B16, connecting the link connection points L11 to L16, are disposed clockwise in this order. The link mechanism for displacement amplification comprises the following four groups: group 1 consisting of the link connection points L11, L12 and the bar B11 connecting these points; group 2 consisting of the link connection points L12, L13 and the bar B12 connecting these points; group 3 consisting of the link connection points L14, L15 and the bar B14 connecting these points; and group 4 consisting of the link connection points L15, L16 and the bar B15 connecting these points.

The link mechanism for displacement amplification is thus constructed in an annular shape. The operation of the link mechanism for displacement amplification will now be described taking the group 1 as an example. It is noted that the groups 1 and 2 are disposed vertically symmetrically, the groups 1 and 4 are disposed horizontally symmetrically, and the groups 2 and 3 are disposed horizontally symmetrically. Accordingly, the operation of the group 1 is identical to the operation of each of the other three groups, and therefore a description of the other groups is omitted.

The link mechanism for displacement amplification operates to amplify a small displacement to produce a large displacement by using the principle of leverage. In particular, the link mechanism has a point of effort, a fulcrum and a point of load, which are essential for leverage. In FIG. 6, the link connection point L11 belonging to the group 1 acts as a point E1 of effort: Due to the displacement C1 produced in the support iron core 3a by the supply of electric current to the wiring 6, a displacement G11 toward the gap 5 is produced in the link connection point L11 in the direction of the arrow of FIG. 6. The point F1 of intersection between a line L11, extending from the link connection point L11 in a horizontal direction in which the movable iron core 4b is convex curved, and a line L12 extending from the link connection point L12 vertically toward the support iron core 3a, serves as a fulcrum. The link connection point L12 serves as a point L1 of load where a displacement G12 is produced, in a direction in which the movable iron core 4b is convex curved, by leverage amplification of the displacement G11 which is produced at the link connection point L11 as the point E1 of effort.

The midpoint of the movable iron core 4b is displaced by a distance D1 in a direction in which the movable iron core 4b is convex curved. The displacement is illustrated by the broken lines and the symbol D1 in FIG. 6 in the portion of the movable iron core 4b.

The displacement amplification ratio is defined by the ratio of the distance D1 to the distance C1, and can be determined in the following manner. A line S1 is drawn vertically downward from the point E1 of effort. The angle formed between the line S1 and the bar B11, i.e. the line connecting the point E1 of effort and the point L1 of load, is represented by θ1, and the length of the bar B11 is represented by l1. The displacement amplification ratio A1 is equal to the ratio of the distance between the fulcrum F1 and the point L1 of load to the distance between the fulcrum F1 and the point E1 of effort, and can therefore be determined by the following equation:

$$A1 = l1 \cos θ1 / l1 \sin θ1 = \cot θ1 \qquad (12)$$

Because of the above-described positional relationship between the groups 1 to 4, the same holds true for the groups 2 to 4. The link connection point L12, i.e. the point L1 of load, is common to the groups 1 and 2. Thus, the displacement produced at the link connection point L12 is identical to the displacement D1 which is produced by the displacement amplification mechanisms of both of the groups 1 and 2.

The same holds true for the link connection point L15 of the movable iron core 4a.

As described hereinabove, according to this embodiment, a change caused in the length of the gap 5 between the two opposing surfaces 2as, 2bs of the attracting iron cores 2a, 2b can be amplified by the support iron cores 3a, 3b and the movable iron cores 4a, 4b and a large displacement can be produced at the point of displacement (point of load) L1. Referring to FIG. 6, the link connection point L1 as a point of load and the link connection point L15, which opposes the link connection point L1, serve as a pair of opposing displacement amplification points in the displacement amplification mechanism 1A which produces a large displacement.

The number of the displacement amplification points in the displacement amplification mechanism 1A is not limited to two: three, four or more displacement amplification points may be provided.

The amplification of displacement makes it possible to secure a sufficient thrust force at least at a certain level over a wide displacement range which is intended to be used. Further, a sufficiently high thrust force can be obtained at a lower electric current even when the displacement is large. This can eliminate the necessity of using an electronic part(s), which is adapted for high electric current, in a current supply circuit, making it possible to avoid an increase in the cost or size of the circuit. When the magnetic flux in the magnetic circuit is decreased, the attracting iron cores 2a, 2b are returned to the original positions by the elastic forces of the support iron cores 3a, 3b and the movable iron cores 4a, 4b, constituting the displacement amplification mechanism 1A. Therefore, there is no need to separately provide an elastic body in order to return the attracting iron cores 2a, 2b to the original positions, making it possible to reduce the size and the cost of the displacement amplification mechanism 1A. In addition, the displacement amplification mechanism 1A, because of its integrated overall structure, can be easily produced e.g. in a single process step by using a mold.

<Second Embodiment of Electromagnetic Actuator>

Figure 8A:
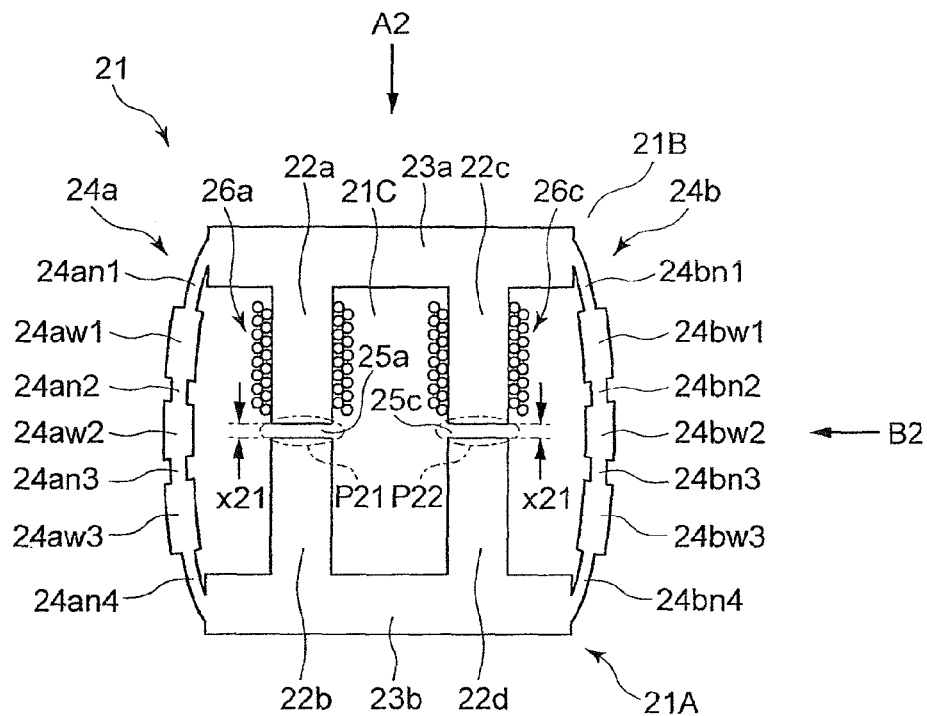
FIGS. 8(a) through 8(c) are diagrams showing an electromagnetic actuator according to a second embodiment of the present invention.
Figure 8B:
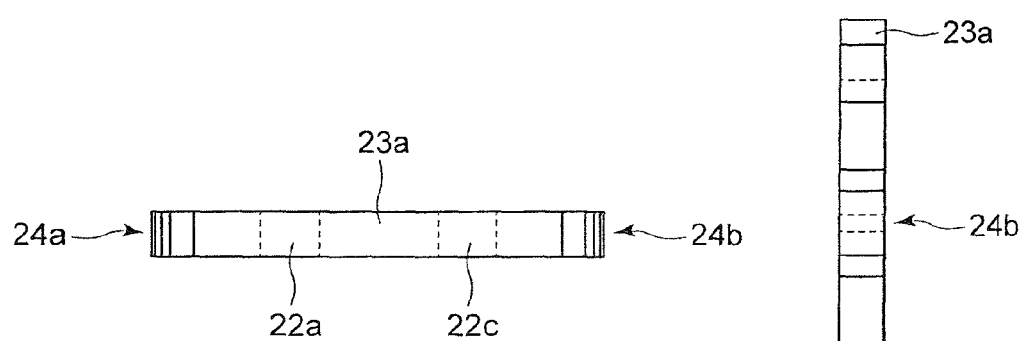
Figure 8C:
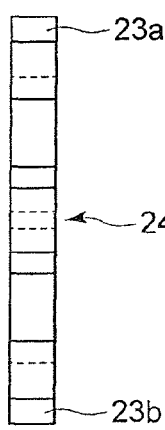
Figure 9:
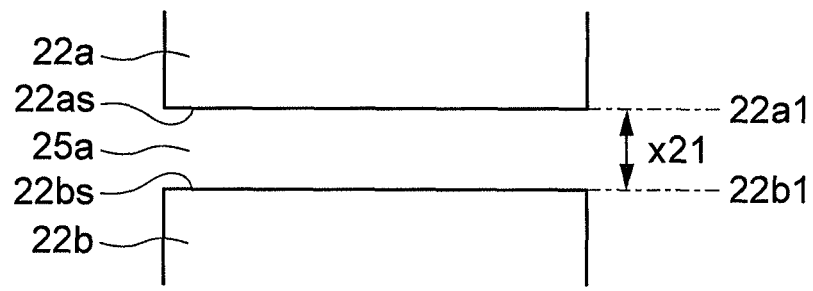
FIG. 9 is an enlarged view of the area P21 of FIG. 8(a)
Figure 10:
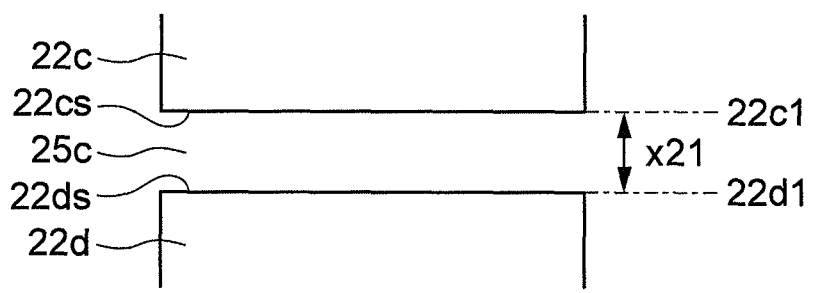
FIG. 10 is an enlarged view of the area P22 of FIG. 8(a)

A second embodiment of the instant electromagnetic actuator will now be described with reference to FIGS. 8 through 16. FIG. 8(a) is a front view of an electromagnetic actuator, FIG. 8(b) shows the electromagnetic actuator of FIG. 8(a) as viewed in the direction of arrow A2, and FIG. 8(c) shows the electromagnetic actuator of FIG. 8(a) as viewed in the direction of arrow B2. FIG. 9 is an enlarged view of the area P21 of FIG. 8(a) and FIG. 10 is an enlarged view of the area P22 of FIG. 8(a).

As shown in FIGS. 8(a) through 8(c) and FIG. 9, the electromagnetic actuator 21 has two points of displacement (points of load) as will be described later. The electromagnetic actuator 21 includes a displacement amplification mechanism 21A made of a magnetic material, having a quadrangular cross-section, having two opposing surfaces 22as, 22bs which form a gap 25a between them and having two opposing surfaces 22cs, 22ds which form a gap 25c between them, and coils (windings) 26a, 26c provided in the displacement amplification mechanism 21A and which generate a magnetic flux in the displacement amplification mechanism 21A. By passing an electric current through the coils 26a, 26c, a magnetic flux is generated in the displacement amplification mechanism 21A to cause a change in the lengths x21, x22 of the gaps 25a, 25c between the surfaces 22as, 22bs and between the surfaces 22cs, 22ds, respectively, thereby displacing the points of displacement.

The displacement amplification mechanism 21A will now be described. The displacement amplification mechanism 21A includes a pair of support iron cores 23a. 23b comprised of elastic members, a pair of movable iron cores 24a, 24b comprised of elastic members and located on both sides of the pair of support iron cores 23a, 23b, a pair of attracting iron cores 22a, 22b extending inwardly from the support iron cores 23a, 23b and having the two opposing surfaces 22as, 22bs which form the gap 25a, and a pair of attracting iron cores 22c, 22d extending inwardly from the support iron cores 23a, 23b and having the two opposing surfaces 22cs, 22ds which form the gap 25c.

The support iron cores 23a, 23b and the movable iron cores 24a, 24b constitute an annular portion 21B, and the pair of attracting iron cores 22a, 22b and the pair of attracting iron cores 22c, 22d constitute a displacement portion 21C.

The constituent members of the displacement amplification mechanism 21A will now be described in further detail. An intermediate portion of the support iron core 23a is connected to one end of the attracting iron core 22a and another intermediate portion of the support iron core 23a is connected to one end of the attracting iron core 22c; the support iron core 23a and the attracting iron cores 22a, 22c form a Π-shaped portion. Similarly, an intermediate portion of the support iron core 23b, having the same shape as the support iron core 23a, is connected to one end of the attracting iron core 22b having the same shape as the attracting iron core 22a and another intermediate portion of the support iron core 23b is connected to one end of the attracting iron core 22d having the same shape as the attracting iron core 22c; the support iron core 23a and the attracting iron cores 22a, 22c form a Π-shaped portion. The surfaces of the other ends of the attracting iron cores 22a, 22c face the surfaces of the other ends of the attracting iron cores 22b, 22d. The movable iron cores 24a, 24b are connected to the opposite ends of the support iron cores 23a and 23b.

The movable iron cores 24a. 24b are slightly convex curved outward, i.e. in a direction away from the attracting iron cores 22a, 22b and the attracting iron cores 22c, 22d.

The movable iron cores 24a, 24b each consist of portions which are formed thick and portions which are formed thin in a direction in which they are convex curved, the thick portions and the thin portions being arranged alternately. In particular, the movable iron core 24a consists of: a movable iron core thin portion 24an1 coupled to the support iron core 23a, a movable iron core thick portion 24aw1, a movable iron core thin portion 24*an*2; a movable iron core thick portion 24*aw*2, a movable iron core thin portion 24*an*3, a movable iron core thick portion 24*aw*3, and a movable iron core thin portion 24*an*4 coupled to the support iron core 23*b*, the portions being arranged in this order.

Similarly, the movable iron core 24*b* consists of: a movable iron core thin portion 24*bn*1 coupled to the support iron core 23*a*, a movable iron core thick portion 24*bw*1, a movable iron core thin portion 24*bn*2; a movable iron core thick portion 24*bw*2, a movable iron core thin portion 24*bn*3, a movable iron core thick portion 24*bw*3, and a movable iron core thin portion 24*bn*4 coupled to the support iron core 23*b*, the portions being arranged in this order.

As described above, the support iron cores 23*a*, 23*b* and the movable iron cores 24*a*. 24*b* constitute the annular portion 21B. Further, as described above, the opposing surfaces 22*as*. 22*bs* of the attracting iron cores 22*a*, 22*b* form the slight gap 25*a* with the length x21, and the opposing surfaces 22*cs*, 22*ds* of the attracting iron cores 22*c*, 22*d* form the slight gap 25*c* with the length x21.

The wirings 26*a*, 26*c*, composed of a linear conductive material such as a copper wire, are wound around the attracting iron cores 22*a*, 22*c*, respectively.

The wirings 26*a*. 26*c* are omitted in FIGS. 8(*b*) and 8(*c*). As shown in FIGS. 8(*b*) and 8(*c*), the cross-sectional area of each of the attracting iron cores 22*a*, 22*b*, 22*c*, 22*d* is approximately the same as the cross-sectional area of each of the support iron cores 23*a*, 23*b*. As shown in FIGS. 9 and 10 which are enlarged views of the areas P21, P22 of FIG. 8(*a*), respectively, the gap 25*a* is formed between the opposing surfaces 22*as*, 22*bs*, lying at positions 22*a*1, 22*b*1, of the attracting iron cores 22*a*, 22*b*, with the distance between the positions 22*a*1, 22*b*1 being x21. Similarly, the gap 25*c* is formed between the opposing surfaces 22*cs*, 22*ds*, lying at positions 22*c*1, 22*d* 1, of the attracting iron cores 22*c*, 22*d*, with the distance between the positions 22*c*1, 22*d*1 being x21.

The operation of the electromagnetic actuator of this embodiment, having the above-described construction, will now be described with reference to FIGS. 11 through 13.

Figure 11:
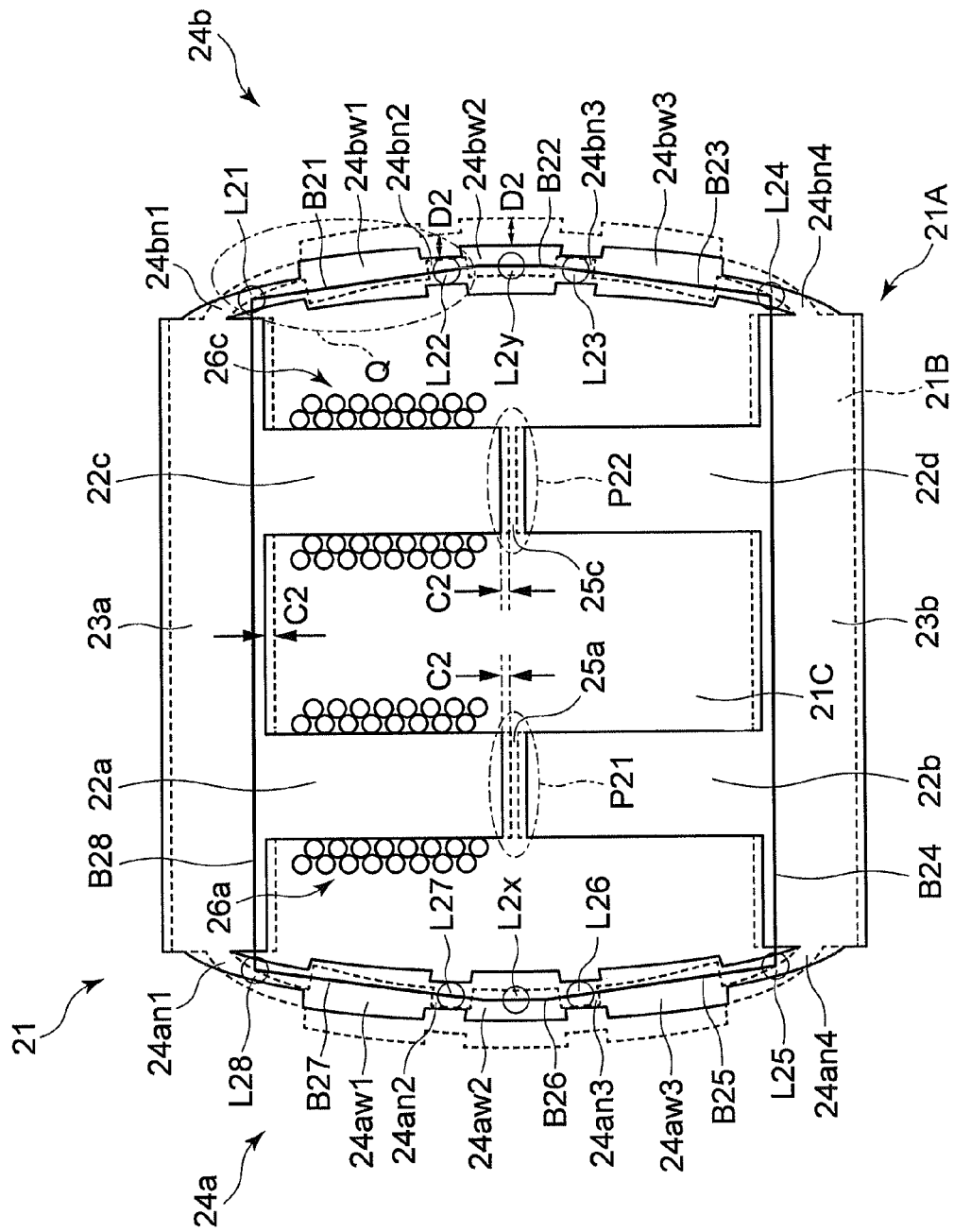
FIG. 11 is an enlarged view of the electromagnetic actuator of FIG. 8(a)

FIG. 11 is an enlarged view of the electromagnetic actuator of FIG. 8(*a*). When a voltage is applied to the windings (coils) 26*a*, 26*c* by connecting a not-shown power source to both ends of the coils (wirings) 26*a*, 26*c*, an electric current is supplied to the wirings 26*a*, 26*c*. Upon the supply of electric current, a magnetic circuit is formed through which a magnetic flux passes as follows: attracting iron core 22*a*→support iron core 23*a*→attracting iron core 22*c*→gap 25*c*→attracting iron core 22*d*→support iron core 23*b*→attracting iron core 22*b*→gap 25*a*→attracting iron core 22*a*. The magnetic flux in the magnetic circuit increases by the supply of electric current. The displacement amplification mechanism 21A thus forms the magnetic circuit including the support iron cores 23*a*, 23*b* and the movable iron cores 24*a*, 24*b* and through which a magnetic flux passes. The magnetic circuit includes the gap (thrust portion) 25*a* formed between the surfaces 22*as*, 22*bs* of the attracting iron cores 22*a*, 22*b* of magnetic material, and the gap (thrust portion) 25*c* formed between the surfaces 22*cs*, 22*ds* of the attracting iron cores 22*c*, 22*d* of magnetic material, as shown in FIGS. 9 and 10. Therefore, an attraction force (thrust force) is generated between the surfaces 22*as*, 22*bs* through the gap 25*a*, and an attraction force is generated between the surfaces 22*cs*, 22*ds* through the gap 25*c*. Because the support iron cores 23*a*, 23*b* and the movable iron cores 24*a*, 24*b* are comprised of elastic members, the attraction force generated between the opposing surfaces 22*as*, 22*bs* of the attracting iron cores 22*a*, 22*b* causes the surfaces 22*as*, 22*bs* to move closer to each other, and the attraction force generated between the opposing surfaces 22*cs*, 22*ds* of the attracting iron cores 22*c*, 22*d* causes the surfaces 22*cs*, 22*ds* to move closer to each other.

Figure 12:
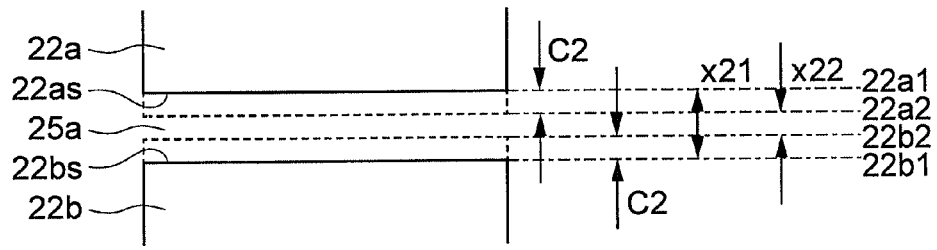
FIG. 12 is an enlarged view of the area P21 of FIG. 11.
Figure 13:
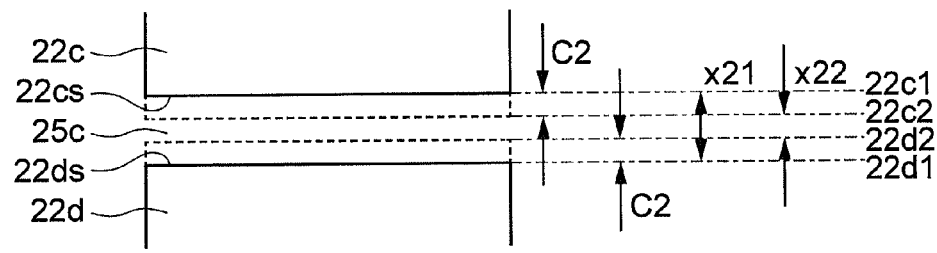
FIG. 13 is an enlarged view of the area P22 of FIG. 11.

The movement is illustrated in FIGS. 12 and 13 which are enlarged views of the area P21 and the area P22, respectively, of FIG. 11. When no electric current is flowing in the wirings 26*a*, 26*c* in FIG. 11, the positions of the opposing surfaces 22*as*, 22*bs* of the attracting iron cores 22*a*, 22*b* are 22*a*1 and 22*b*1, respectively, in FIG. 12 and the distance between them is x21 as in FIG. 9. This is illustrated by the solid lines in FIG. 12.

As described above, when an electric current flows in the wirings 26*a*, 26*c* in FIG. 11, an attraction force acts between the opposing surfaces 22*as*, 22*bs* of the attracting iron cores 22*a*, 22*b*, whereby the position of the surface 22*as* and the position of the surface 22*bs* come closer to 22*a*2 and 22*b*2, respectively, and the gap 25*a* becomes narrower; the distance between the surfaces 22*as*, 22*bs* becomes x22 as shown by the broken lines in FIG. 12. Thus, by supplying the electric current to the wirings 26*a*, 26*c*, a displacement C2 is produced in each of the surfaces 22*as*, 22*bs* as shown in FIG. 12.

When the application of voltage to the wirings 26*a*, 26*c* is shut off, the electric current disappears and the magnetic flux in the above-described magnetic circuit decreases, whereby the attraction force, acting between the surfaces 22*as*, 22*bs*, disappears. Because the support iron cores 23*a*, 23*b* and the movable iron cores 24*a*, 24*b* are comprised of elastic members, the opposing surfaces 22*as*, 22*bs* of the attracting iron cores 22*a*, 22*b* return to the positions 22*a*1, 22*b*1, respectively.

Thus, the gap 25*a* returns to the state as observed when there is no electric current flowing in the wirings 26*a*, 26*c*, i.e. when there is no generation of magnetic flux; the distance between the surfaces 22*as*, 22*bs* becomes x21.

As described above, a displacement C2 is produced in each of the opposing surfaces 22*as*, 22*bs* of the attracting iron cores 22*a*, 22*b* in the electromagnetic actuator 21. The same displacement C2 is produced by the same mechanism in the gap 25*c* between the attracting iron cores 22*c*, 22*d*, shown in FIG. 13.

The displacement C2 produced in each of the opposing surfaces 22*as*, 22*bs* of the attracting iron cores 22*a*, 22*b*, and the displacement C2 produced in each of the opposing surfaces 22*cs*, 22*ds* of the attracting iron cores 22*c*, 22*d* are illustrated also in the areas P21, P22 of FIG. 11.

In this embodiment the attracting iron cores 22*a*, 22*b*, 22*c*, 22*d* thus return to the original positions by the elastic forces of the support iron cores 23*a*, 23*b* and the movable iron cores 24*a*, 24*b*, constituting the displacement amplification mechanism 21A.

Therefore, there is no need to separately provide an elastic body in order to return the attracting iron cores 22*a*. 22*b*, 22*c*, 22*d* to the original positions, making it possible to reduce the size and the cost of the displacement amplification mechanism 21A.

The mechanism of amplification of the displacement C2 will now be described with reference to FIG. 11.

The displacement C2 in each of the opposing surfaces 22*as*, 22*bs* of the attracting iron cores 22*a*, 22*b* in the area P21, shown by the broken lines in FIG. 11, is produced at the opposing ends of the attracting iron cores 22*a*, 22*b*. Therefore, the same displacement C2 in the same direction is produced also in the support iron cores 23*a*, 23*b* whose intermediate portions are connected to the other ends of the attracting iron cores 22a, 22b. This is illustrated in FIG. 11 in the portion of the support iron core 23a by the broken lines and the symbol C2, indicating the same displacement as in the attracting iron core 22a. The displacement C2 of the support iron core 23a is amplified by the support iron core 23a and by the movable iron cores 24a, 24b connected to both ends of the support iron core 23a. The support iron core 23a and the support iron core 23b are disposed vertically symmetrically. Thus, the support iron cores 23a, 23b and the movable iron cores 24a, 24b as a whole constitute a link mechanism for displacement amplification.

The principle will now be described with reference to a link mechanism as applied to the support iron cores 23a, 23b and the movable iron cores 24a, 24b, constituting the displacement amplification mechanism 21A. The link mechanism has eight link connection points: a connection point L21 between the support iron core 23a and the movable iron core thin portion 24bn1; a midpoint L22 of the movable iron core thin portion 24bn2; a midpoint L23 of the movable iron core thin portion 24bn3; a connection point L24 between the movable iron core thin portion 24bn4 and the support iron core 23b: a connection point L25 between the support iron core 23b and the movable iron core thin portion 24an4; a midpoint L26 of the movable iron core thin portion 24an3; a midpoint L27 of the movable iron core thin portion 24an2; and a connection point L28 between the movable iron core thin portion 24an1 and the support iron core 23a. The link connection points L21, L22, L23, L24, L25, L26, L27, L28 are disposed clockwise in this order. As shown in FIG. 11, bars B21, B22, B23, B24, B25, B26, B27, B28, connecting the link connection points L21 to L28, are disposed clockwise in this order.

The link mechanism for displacement amplification comprises the following four groups: group 1 consisting of the link connection points L21, L22 and the bar B21 connecting these points; group 2 consisting of the link connection points L23, L24 and the bar B23 connecting these points; group 3 consisting of the link connection points L25, L26 and the bar B25 connecting these points; and group 4 consisting of the link connection points L27, L28 and the bar B27 connecting these points.

Figure 14:
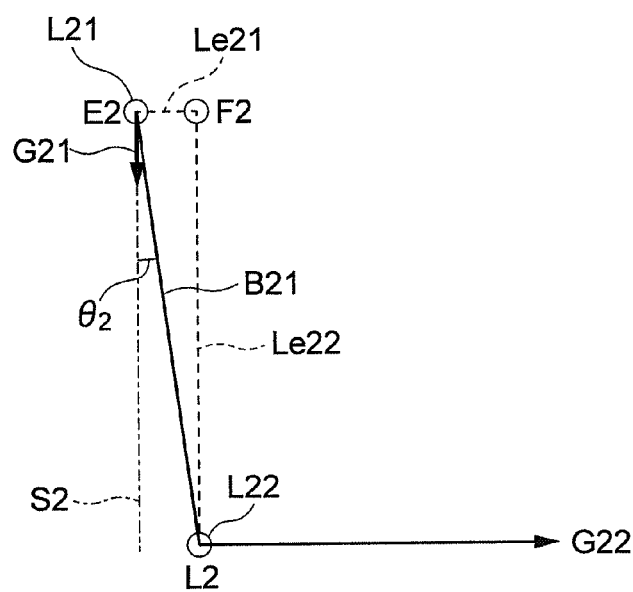
FIG. 14 is an enlarged view of the area Q of FIG. 11.

The link mechanism for displacement amplification is thus constructed in an annular shape. The operation of the link mechanism for displacement amplification will now be described with reference to FIGS. 11 and 14, taking the group 1 as an example. FIG. 14 is an enlarged view of the group 1, i.e. the area Q of FIG. 11. It is noted that the groups 1 and 2 are disposed vertically symmetrically, the groups 1 and 4 are disposed horizontally symmetrically, and the groups 2 and 3 are disposed horizontally symmetrically. Accordingly, the operation of the group 1 is identical to the operation of each of the other three groups, and therefore a description of the other groups is omitted.

In FIG. 11, the link connection point L21 belonging to the group 1 acts as a point E2 of effort (FIG. 14): Due to the displacement C2 produced in the support iron core 23a by the application of voltage to the wirings 26a, 26b, a displacement G21 toward the gap 25c is produced in the link connection point L21 in the direction of the arrow of FIG. 14. The point F2 (FIG. 14) of intersection between a line Le21 (FIG. 14), extending from the link connection point L21 in a horizontal direction in which the movable iron core 24b is convex curved, and a line Le22 (FIG. 14) extending from the link connection point L22 vertically toward the support iron core 23a, serves as a fulcrum. The link connection point L22 serves as a point L2 of load (FIG. 14) where a displacement G22 is produced, in a direction in which the movable iron core 24b is convex curved, by leverage amplification of the displacement G21 which is produced at the link connection point L21 as the point E2 of effort.

The link connection point L22 is displaced by a distance D2 (FIG. 11) in a direction in which the movable iron core 24b is convex curved.

The displacement amplification ratio is defined by the ratio of the distance D2 to the distance C2 in FIG. 11, and can be determined in the following manner: A line S2 is drawn vertically downward from the point E2 of effort. The angle formed between the line S2 and the bar B21, i.e. the line connecting the point E2 of effort and the point L2 of load, is represented by 92, and the length of the bar B21 is represented by 12. The displacement amplification ratio A2 is equal to the ratio of the distance between the fulcrum F2 and the point L2 of load to the distance between the fulcrum F2 and the point E2 of effort, and can therefore be determined by the following equation:

$$A2 = l2 \cos \theta 2 / l2 \sin \theta 2 = \cot \theta 2 \qquad (13)$$

Because of the above-described positional relationship between the groups 1 to 4, the same holds true for the groups 2 to 4.

Consider now an operating point L2y which is a midpoint between the link connection point L22 as the point of load in the group 1 and the link connection point L23 as the point of load in the group 2. The operating point L2y is the midpoint of the movable iron core 24b, and therefore the same displacement D2 as in the link connection points L22 and L23 is produced in the operating point L2y. The same holds true for an operating point L2x which is a midpoint between the link connection point L26 of the group 3 and the link connection point L27 of the group 4, and which is the midpoint of the movable iron core 24a.

Referring to FIG. 11, the operating point L2y as a point of load and the operating point L2x, which opposes the operating point L2y, serve as a pair of opposing displacement amplification points in the displacement amplification mechanism 21A which produces a large displacement.

The number of the displacement amplification points in the displacement amplification mechanism 21A is not limited to two: three, four or more displacement amplification points may be provided.

As shown in FIG. 8(a), the movable iron cores 24a, 24b each consist of portions which are formed thick and portions which are formed thin in a direction in which they are curved, i.e. in a direction in which displacement occurs, the thick portions and the thin portions being arranged alternately. Compared to the movable iron cores 4a, 4b of the electromagnetic actuator 1 of the first embodiment, shown in FIG. 1, the movable iron cores 24a, 24b can move easily by the amplified displacement because of the presence of the thin portions.

On the other hand, because of the presence of a considerable proportion of the thin portions, having a relatively small cross-sectional area, in the movable iron cores 24a, 24b, a magnetic circuit including the movable iron cores 24a, 24b may have an increased reluctance.

It may therefore be difficult only with the magnetic circuit including the movable iron cores 24a, 24b to generate such a high magnetic flux as to be capable of generating a sufficiently high attraction force between the opposing surfaces 22as, 22bs on both sides of the gap 25a, shown in FIG. 9, and between the opposing surfaces 22cs, 22ds on both sides of the gap 25c, shown in FIG. 10. It is, however, possible to secure an amount of magnetic flux that can generate a sufficiently high attraction force between the opposing surfaces by constructing a magnetic circuit including the attracting iron cores 22a, 22b, 22c, 22d having a large cross-sectional area. Thus, the support iron cores 23a, 23b, which are part of the members (the support iron cores 23a, 23b and the movable iron cores 24a, 24b) constituting the displacement amplification mechanism 21A, are used to constitute the principal magnetic circuit.

Figure 15:
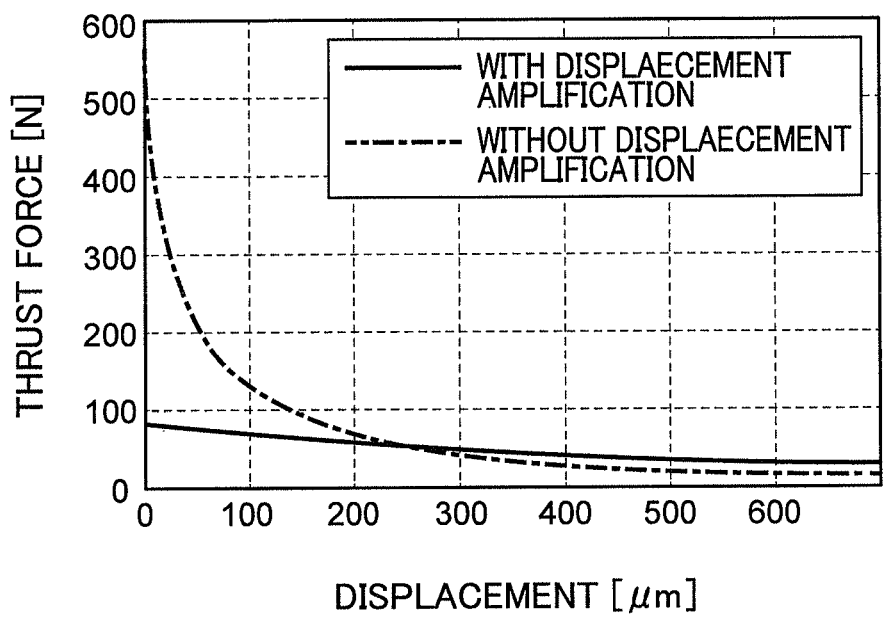
FIG. 15 is a graph showing the relationship between displacement and thrust force in the electromagnetic actuator of the second embodiment.

FIG. 15 is a graph showing an exemplary relationship between displacement and thrust force in the electromagnetic actuator of the second embodiment. The dashed-dotted line shows a relationship as observed when no displacement amplification is made, while the solid line shows a relationship as observed when the displacement amplification is made, the relationships being determined under constant electric current conditions. As can be seen in FIG. 15, the thrust force with the displacement amplification is larger than the thrust force without the displacement amplification when the displacement is larger than 250 µm, which is the displacement value at the intersection of the dashed-dotted line and the solid line. Conversely, the thrust force with the displacement amplification is smaller than the thrust force without the displacement amplification when the displacement is smaller than 250 µm.

The data in FIG. 15 also demonstrates that by making the displacement amplification, the range of change in the thrust force is reduced over a wide range of distribution. It therefore becomes possible to secure a sufficient thrust force at least at a certain level over a wide displacement range which is intended to be used.

Figure 16:
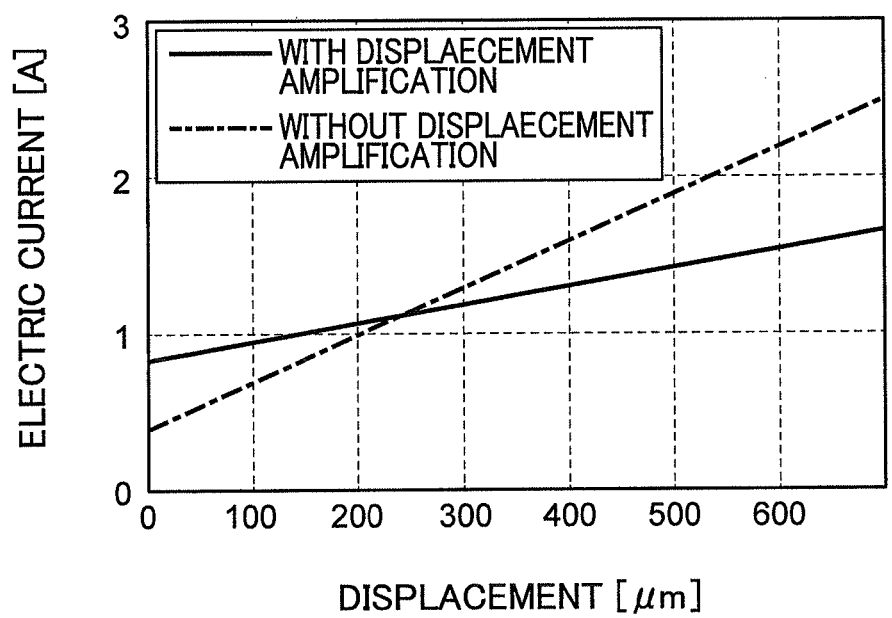
FIG. 16 is a graph showing the relationship between displacement and electric current in the electromagnetic actuator of the second embodiment.
Figure 18:
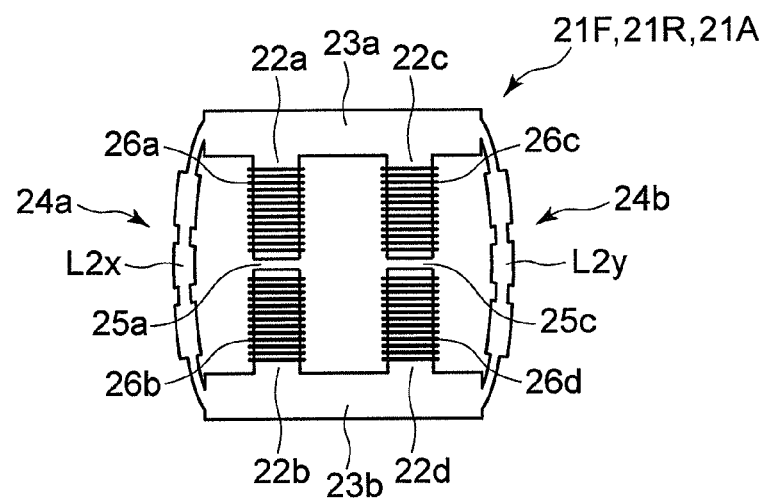
FIG. 18 is a diagram showing the shape of the electromagnetic actuator.

FIG. 16 is a graph showing an exemplary relationship between displacement and electric current in the electromagnetic actuator of the second embodiment. The dashed-dotted line shows a relationship as observed when no displacement amplification is made, while the solid line shows a relationship as observed when the displacement amplification is made, the relationships being determined under constant thrust force conditions. As can be seen in FIG. 16, the electric current with the displacement amplification is lower than the electric current without the displacement amplification when the displacement is larger than 250 µm, which is the displacement value at the intersection of the dashed-dotted line and the solid line. Conversely, the electric current with the displacement amplification is higher than the electric current without the displacement amplification when the displacement is smaller than 250 µm. As described above, this means that when it is intended to obtain a sufficient thrust force in a displacement range which is higher than a certain displacement, it is not necessary to use an electronic part(s), which is adapted for high electric current, in a current supply circuit, making it possible to avoid an increase in the cost or size of the circuit.

<First Embodiment of Gripper Mechanism>

The instant gripper mechanism using an electromagnetic actuator will now be described.

FIGS. 17(a) through 17(c) and FIG. 18 are diagrams illustrating a first embodiment of the instant gripper mechanism using an electromagnetic actuator.

The instant gripper mechanism using an electromagnetic actuator will be described first with reference to FIGS. 17(a) through 17(c) and FIG. 18.

As shown in FIGS. 17(a) through 17(c), the gripper mechanism using an electromagnetic actuator is disposed in an elongated transport guide 35 including at least two rails, e.g. a pair of rails 35a, 35b, each having an inner surface. The gripper mechanism is comprised of electromagnetic actuators 21F, 21R provided in the pair of rails 35a, 35b. It is also possible to use a pipe-shaped elongated guide 35 having an inner surface, and to dispose a movement mechanism 30 in the interior of the pipe-shaped guide 35.

The electromagnetic actuators 21F, 21R, constituting the gripper mechanism, will now be described with reference to FIGS. 17(a) through 17(c) and FIG. 18.

The electromagnetic actuators 21F, 21R shown in FIGS. 17(a) through 17(c) and FIG. 18 each have approximately the same structure as the electromagnetic actuator 21 shown in FIGS. 8(a) through 8(c) and FIG. 16.

The same reference numerals are used for those portions of the electromagnetic actuators 21F, 21R shown in FIGS. 17(a) through 17(c) and FIG. 18 which are the same as the electromagnetic actuator 21 shown in FIGS. 8(a) through 8(c) and FIG. 16, and a detailed description thereof will be omitted.

As shown in FIGS. 17(a) through 17(c) and FIG. 18, the electromagnetic actuators 21F, 21R of the gripper mechanism each comprise a displacement amplification mechanism 21A made of a magnetic material and having at least one displacement amplification point, e.g. two displacement amplification points L2x, L2y, and four coils (windings) 26a, 26b, 26c, 26d provided in the displacement amplification mechanism 21A and which generate a magnetic flux in the displacement amplification mechanism 21A. A magnetic flux is generated in the displacement amplification mechanism 21A made of a magnetic material by passing an electric current through the coils 26a, 26b, 26c, 26d. The magnetic flux acts to decrease the lengths of the gaps 25a, 25c, thereby displacing the displacement amplification points L2x, L2y.

The displacement amplification mechanism 21A may have one displacement amplification point, or two or more displacement amplification points.

The displacement amplification mechanism 21A of the electromagnetic actuator 21F, 21R will now be described. The displacement amplification mechanism 21A includes a pair of support iron cores 23a, 23b comprised of elastic members, a pair of movable iron cores 24a, 24b located on both sides of the pair of support iron cores 23a, 23b, a pair of attracting iron cores 22a, 22b extending inwardly from the support iron cores 23a, 23b and having two opposing surfaces which form the gap 25a, and a pair of attracting iron cores 22c, 22d extending inwardly from the support iron cores 23a, 23b and having two opposing surfaces which form the gap 25c.

The coils 26a, 26b, 26c, 26d are wound on the attracting iron cores 22a, 22b, 22c. 22d, respectively.

By passing an electric current through the coils 26a, 26b, 26c, 26d, a magnetic flux is generated in the displacement amplification mechanism 21A of the electromagnetic actuator 21F, 21R of the gripper mechanism to cause a change in the lengths of the gaps 25a, 25c, thereby displacing the displacement amplification points L2x, L2y outwardly (see FIG. 17(b)). By decreasing the electric current applied to the coils 26a, 26b, 26c, 26d, the original lengths of the gaps 25a, 25c are restored by the resilience of the displacement amplification mechanism 21A, whereby the displacement amplification points L2x, L2y are returned to the original positions (see FIG. 17(c)).

The gripper mechanism is comprised of the electromagnetic actuators 21F, 21R having such a construction.

As shown in FIGS. 17(a) through 17(c) and FIG. 18, in each of the electromagnetic actuators 21F, 21R constituting the gripper mechanism, the displacement amplification points L2x. L2y face outward, and are displaced outwardly by passing an electric current through the coils 26a, 26b, 26c, 26d.

As shown in FIGS. 17(a) through 17(c), by passing an electric current through the coils 26a, 26b, 26c, 26d of the electromagnetic actuator 21F, 21R of the gripper mechanism, the displacement amplification points L2x, L2y of the electromagnetic actuator 21F, 21R can be displaced outwardly, thereby bringing the electromagnetic actuator 21F, 21R into contact with the inner surfaces of the rails 35a, 35b. By stopping the application of electric current to the coils 26a, 26b, 26c. 26d of the electromagnetic actuator 21F, 21R, the displacement amplification points L2x, L2y can be displaced inwardly, thereby separating the electromagnetic actuator 21F, 21R from the inner surfaces of the rails 35a, 35b.

<Second Embodiment of Gripper Mechanism>

A second embodiment of the instant gripper mechanism will now be described with reference to FIGS. 32(a) through 32(c).

Figure 32A:
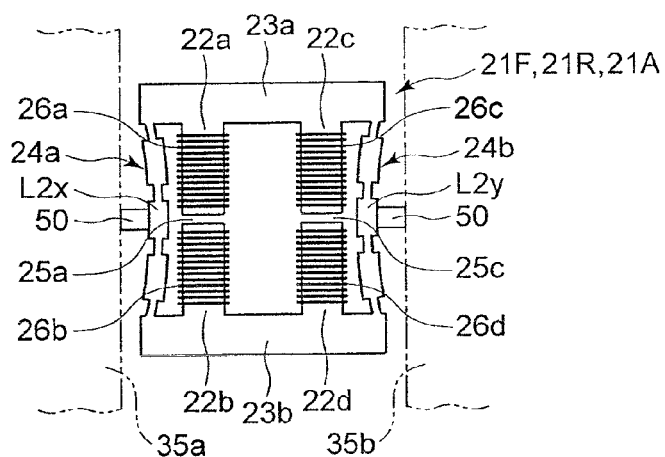
FIGS. 32(a) through 32(c) are diagrams showing a gripper mechanism according to an embodiment of the present invention.
Figure 32B:
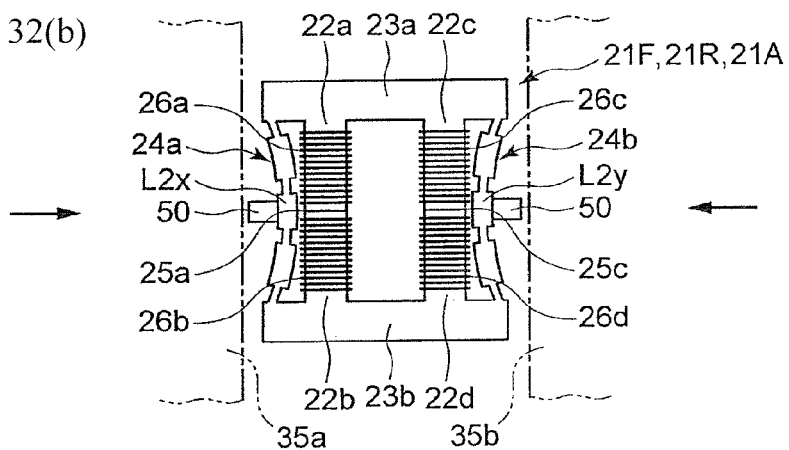
Figure 32C:
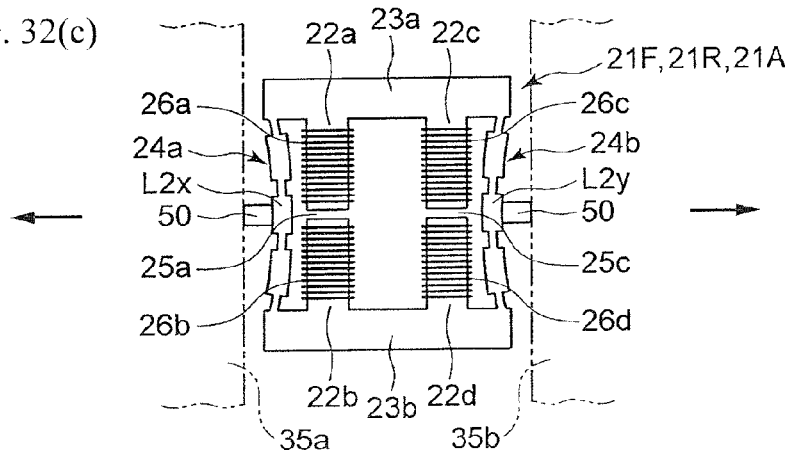

In the embodiment illustrated in FIGS. 32(a) through 32(c), the gripper mechanism includes a pair of electromagnetic actuators 21F, 21R. The electromagnetic actuators 21F, 21R each comprise a displacement amplification mechanism 21A having at least one displacement amplification point, e.g. two displacement amplification points L2x, L2y, and coils 26a, 26b, 26c, 26d provided in the displacement amplification mechanism 21A.

A magnetic flux is generated in the displacement amplification mechanism 21A made of a magnetic material by passing an electric current through the coils 26a, 26b, 26c, 26d. The magnetic flux acts to decrease the lengths of the gaps 25a, 25c, thereby displacing the displacement amplification points L2x, L2y.

The displacement amplification mechanism 21A will now be described. The displacement amplification mechanism 21A includes a pair of support iron cores 23a, 23b comprised of elastic members, a pair of movable iron cores 24a, 24b located on both sides of the pair of support iron cores 23a, 23b, a pair of attracting iron cores 22a, 22b extending inwardly from the support iron cores 23a, 23b and having two opposing surfaces which form the gap 25a, and a pair of attracting iron cores 22c, 22d extending inwardly from the support iron cores 23a, 23b and having two opposing surfaces which form the gap 25c.

The coils 26a, 26b, 26c, 26d are wound on the attracting iron cores 22a, 22b, 22c, 22d, respectively. The pair of movable iron cores 24a, 24b of the displacement amplification mechanism 21A are slightly curved inward.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby displacing the displacement amplification points L2x, L2y inwardly. By decreasing the electric current applied to the coils 26a, 26b, 26c, 26d, the original lengths of the gaps 25a, 25c are restored by the resilience of the displacement amplification mechanism 21A, whereby the displacement amplification points L2x, L2y are returned to the original positions.

As described above, in the embodiment illustrated in FIGS. 32(a) through 32(c), the two displacement amplification points L2x, L2y of each of the electromagnetic actuators 21F, 21R, constituting the gripper mechanism, are displaced inwardly by passing an electric current through the coils, and displaced outwardly and returned to the original positions by decreasing the electric current.

Thus, as shown in FIGS. 32(a) and 32(c), the distance between the displacement amplification points L2x, L2y of the electromagnetic actuator 21F, 21R can be increased by decreasing or stopping the electric current. Therefore, when fixing the electromagnetic actuator 21F, 21R to the rails 35a, 35b, the electric current is decreased or stopped to outwardly displace the displacement amplification points L2x, L2y and bring projecting portions 50 into contact with the inner surfaces of the rails 35a, 35b. The electromagnetic actuator 21F, 21R can thus be fixed to the rails 35a, 35b stably at a low cost.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby inwardly displacing the displacement amplification points L2x, L2y and separating the projecting portions 50 from the rails 35a, 35b (see FIG. 32(b)).

<Third Embodiment of Gripper Mechanism>

A third embodiment of the instant gripper mechanism using an electromagnetic actuator will now be described.

Figure 27A:
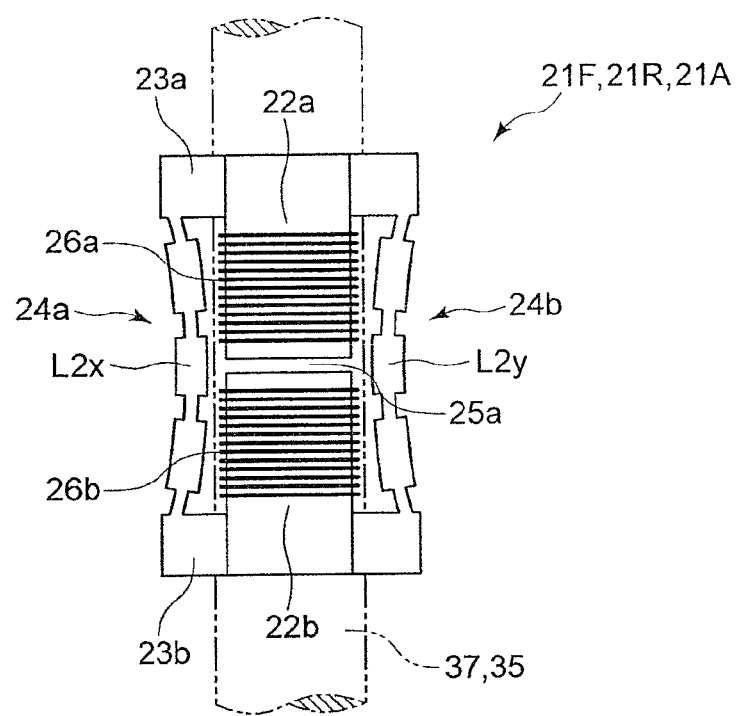
FIGS. 27(a) and 27(b) are diagrams showing an electromagnetic actuator of a gripper mechanism.
Figure 27B:
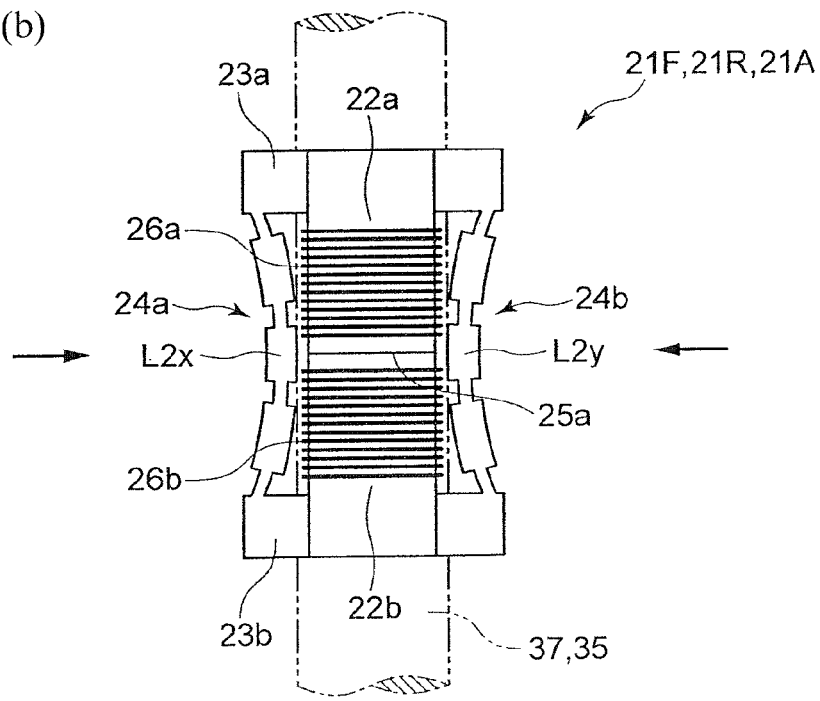

FIGS. 27(a) and 27(b) are diagrams illustrating the third embodiment of the instant gripper mechanism using an electromagnetic actuator.

The instant gripper mechanism using an electromagnetic actuator will be described with reference to FIGS. 27(a) and 27(b).

As shown in FIGS. 27(a) and 27(b), the gripper mechanism using an electromagnetic actuator is mounted on the periphery of a transport guide 35 including a guide rod 37. The gripper mechanism is comprised of electromagnetic actuators 21F, 21R provided on the guide rod 37.

The electromagnetic actuators 21F, 21R, constituting the gripper mechanism, will now be described with reference to FIGS. 27(a) and 27(b).

Figure 26A:
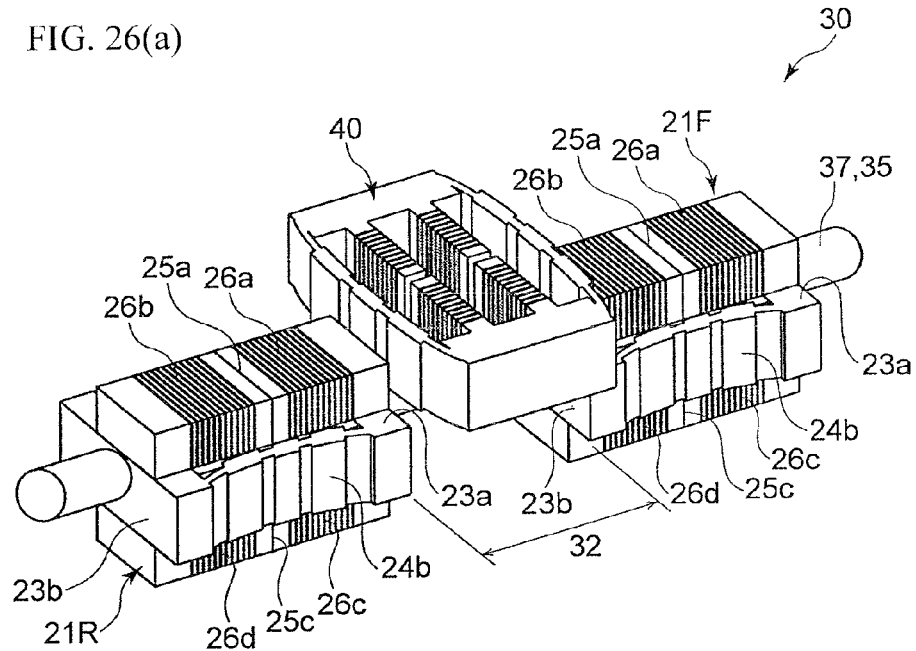
FIGS. 26(a) and 26(b) are diagrams showing a gripper mechanism and a movement mechanism according to an embodiment of the present invention.
Figure 26B:
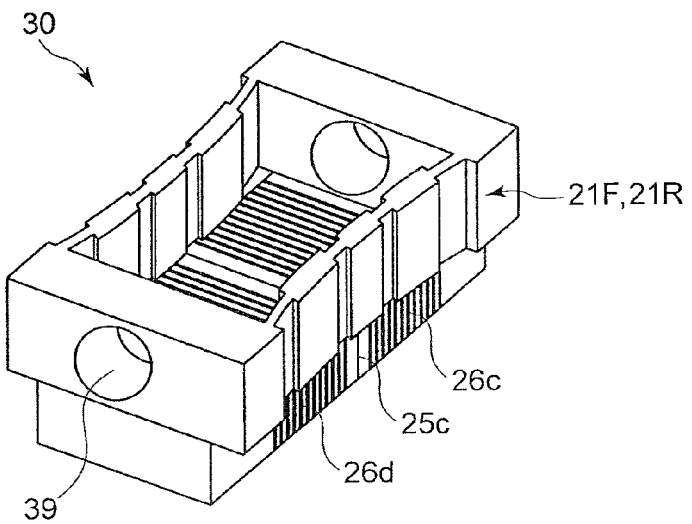

The electromagnetic actuators 21F, 21R shown in FIGS. 27(a) and 27(b) each have openings 39 (see FIGS. 26(a) and 26(b)) through which the guide rod 37 penetrates, and are mounted on the periphery of the guide rod 37. The electromagnetic actuators 21F, 21R of the gripper mechanism each comprise a displacement amplification mechanism 21A made of a magnetic material and having at least one displacement amplification point, e.g. two displacement amplification points L2x, L2y, and four coils (windings) 26a, 26b, 26c, 26d provided in the displacement amplification mechanism 21A and which generate a magnetic flux in the displacement amplification mechanism 21A. A magnetic flux is generated in the displacement amplification mechanism 21A made of a magnetic material by passing an electric current through the coils 26a, 26b, 26c, 26d. The magnetic flux acts to decrease the lengths of the gaps 25a, 25c, thereby displacing the displacement amplification points L2x, L2y (FIGS. 27(a) and 27(b)).

The displacement amplification mechanism 21A may have one displacement amplification point, or two or more displacement amplification points.

The displacement amplification mechanism 21A of the electromagnetic actuator 21F, 21R will now be described with reference to FIGS. 27(a) and 27(b). The displacement amplification mechanism 21A includes a pair of support iron cores 23a, 23b comprised of elastic members, a pair of opposing movable iron cores 24a, 24b located on both sides of the pair of support iron cores 23a, 23b, a pair of attracting iron cores 22a, 22b disposed in a 90-degree rotation position with respect to the support iron cores 23a, 23b and having two opposing surfaces which form the gap 25a, and a pair of attracting iron cores 22c, 22d disposed in a 90-degree rotation position with respect to the support iron cores 23a, 23b and having two opposing surfaces which form the gap 25c.

The coils 26a, 26b, 26c, 26d are wound on the attracting iron cores 22a, 22b, 22c, 22d, respectively.

By passing an electric current through the coils 26a, 26b, 26c, 26d, a magnetic flux is generated in the displacement amplification mechanism 21A of the electromagnetic actuator 21F, 21R of the gripper mechanism to cause a change in the lengths of the gaps 25a, 25c, thereby displacing the displacement amplification points L2x, L2y inwardly (see FIG. 27(b)). By decreasing the electric current applied to the coils 26a, 26b, 26c, 26d, the original lengths of the gaps 25a, 25c are restored by the resilience of the displacement amplification mechanism 21A, whereby the displacement amplification points L2x, L2y are returned to the original positions (see FIG. 27(a)).

FIGS. 27(a) and 27(b) show the electromagnetic actuator 21F, 21R of the gripper mechanism from the side of the pair of attracting iron cores 22a, 22b that form the gap 25a. Thus, only the pair of attracting iron cores 22a, 22b and the coils 26a, 26b wound on the iron cores 22a, 22b are shown in FIGS. 27(a) and 27(b), while the other pair of attracting iron cores 22c, 22d that form the gap 25c and the coils 26c, 26d wound on the iron cores 22c, 22d are not shown.

The gripper mechanism is comprised of the electromagnetic actuators 21F, 21R having such a construction.

As shown in FIGS. 27(a) and 27(b), in each of the electromagnetic actuators 21F, 21R constituting the gripper mechanism, the displacement amplification points L2x, L2y face inward, and are displaced inwardly by passing an electric current through the coils 26a, 26b, 26c, 26d.

As shown in FIGS. 27(a) and 27(b), by passing an electric current through the coils 26a, 26b, 26c, 26d of the electromagnetic actuator 21F, 21R of the gripper mechanism, the displacement amplification points L2x, L2y of the electromagnetic actuator 21F, 21R can be displaced inwardly, thereby bringing the electromagnetic actuator 21F, 21R into contact with the periphery of the guide rod 37. By stopping the application of electric current to the coils 26a, 26b, 26c, 26d of the electromagnetic actuator 21F, 21R, the displacement amplification points L2x, L2y can be displaced outwardly, thereby separating the electromagnetic actuator 21F, 21R from the periphery of the guide rod 37.

<Fourth Embodiment of Gripper Mechanism>

A fourth embodiment of the instant gripper mechanism will now be described with reference to FIGS. 33(a) and 33(b).

Figure 33A:
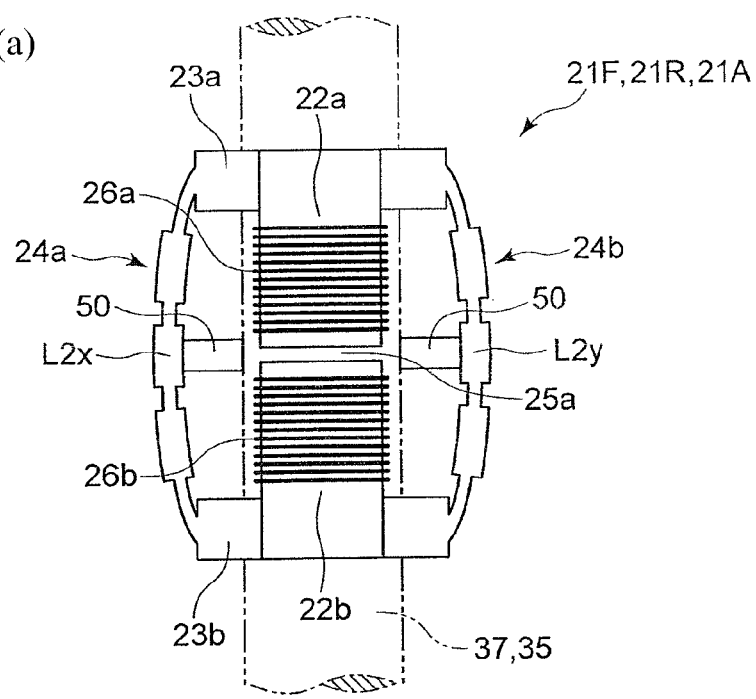
FIGS. 33(a) and 33(b) are diagrams showing a gripper mechanism according to an embodiment of the present invention.
Figure 33B:
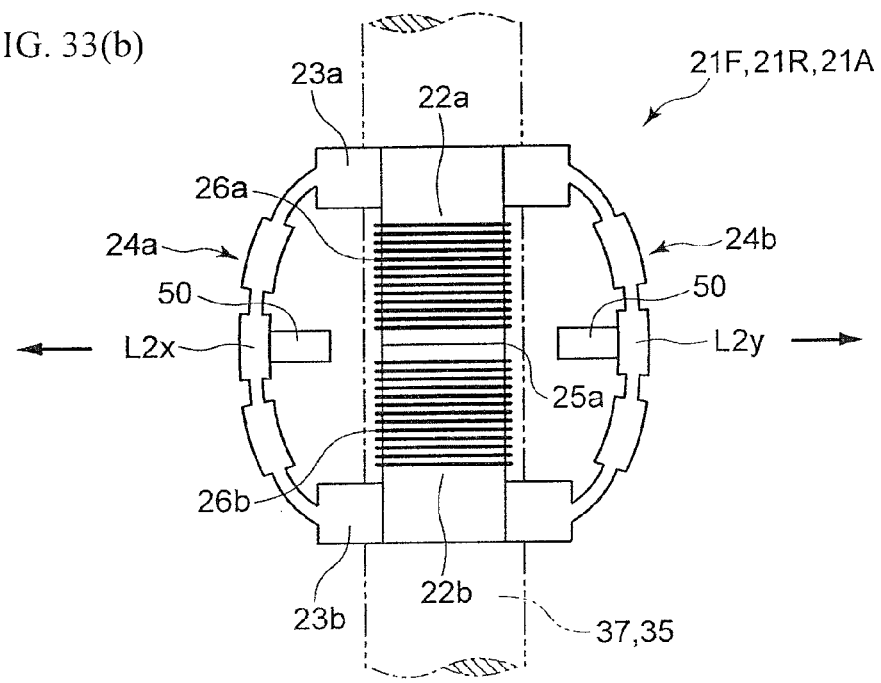

In the embodiment illustrated in FIGS. 33(a) and 33(b), the gripper mechanism includes a pair of electromagnetic actuators 21F, 21R. The electromagnetic actuators 21F, 21R each comprise a displacement amplification mechanism 21A having at least one displacement amplification point, e.g. two displacement amplification points L2x, L2y, and coils 26a, 26b, 26c, 26d provided in the displacement amplification mechanism 21A.

A magnetic flux is generated in the displacement amplification mechanism 21A made of a magnetic material by passing an electric current through the coils 26a, 26b, 26c, 26d. The magnetic flux acts to decrease the lengths of the gaps 25a, 25c, thereby displacing the displacement amplification points L2x, L2y.

The displacement amplification mechanism 21A will now be described. The displacement amplification mechanism 21A includes a pair of support iron cores 23a, 23b comprised of elastic members, a pair of movable iron cores 24a, 24b located on both sides of the pair of support iron cores 23a, 23b, a pair of attracting iron cores 22a, 22b extending inwardly from the support iron cores 23a, 23b and having two opposing surfaces which form the gap 25a, and a pair of attracting iron cores 22c, 22d extending inwardly from the support iron cores 23a, 23b and having two opposing surfaces which form the gap 25c.

The coils 26a, 26b, 26c, 26d are wound on the attracting iron cores 22a, 22b, 22c, 22d, respectively. The pair of movable iron cores 24a, 24b of the displacement amplification mechanism 21A are slightly curved outward.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby displacing the displacement amplification points L2x, L2y outwardly. By decreasing the electric current applied to the coils 26a, 26b, 26c, 26d, the original lengths of the gaps 25a, 25c are restored by the resilience of the displacement amplification mechanism 21A, whereby the displacement amplification points L2x, L2y are returned to the original positions.

As described above, in the embodiment illustrated in FIGS. 33(a) and 33(b), the two displacement amplification points L2x, L2y of each of the electromagnetic actuators 21F, 21R, constituting the gripper mechanism, are displaced outwardly by passing an electric current through the coils, and displaced inwardly and returned to the original positions by decreasing the electric current.

Thus, as shown in FIG. 33(a), the distance between the displacement amplification points L2x, L2y of the electromagnetic actuator 21F, 21R can be decreased by decreasing or stopping the electric current. Therefore, when fixing the electromagnetic actuator 21F, 21R to the periphery of the guide rod 37, the electric current is decreased or stopped to inwardly displace the displacement amplification points L2x, L2y and bring projecting portions 50 into contact with the periphery of the guide rod 37. The electromagnetic actuator 21F, 21R can thus be fixed to the guide rod 37 stably at a low cost.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby outwardly displacing the displacement amplification points L2x, L2y and separating the projecting portions 50 from the periphery of the guide rod 37 (see FIG. 33(b)).

<First Embodiment of Movement Mechanism>

The instant movement mechanism using the above-described gripper mechanism will now be described.

As shown in FIGS. 17 through 22, a movement mechanism 30 using an electromagnetic actuator is disposed in an elongated transport guide 35 including at least two rails, e.g. a pair of rails 35a, 35b, each having an inner surface. The movement mechanism 30 comprises a pair of electromagnetic actuators 21F, 21R provided inside the pair of rails 35a, 35b, and an intermediate actuator 40 which is disposed between and secured to the electromagnetic actuators 21F, 21R and which expands/contracts in the transport direction of the guide 35. It is also possible to use a pipe-shaped elongated guide 35 having an inner surface, and to dispose the movement mechanism 30 in the interior of the pipe-shaped guide 35.

The intermediate actuator 40 has the same construction as each of the electromagnetic actuators 21F, 21R. The electromagnetic actuator 21F is a front electromagnetic actuator, and the electromagnetic actuator 21R is a rear electromagnetic actuator.

The electromagnetic actuators 21F, 21R, constituting the gripper mechanism, will now be described with reference to FIGS. 17(a) through 17(c) and FIG. 18.

The electromagnetic actuators 21F, 21R shown in FIGS. 17(a) through 17(c) and FIG. 18 each have approximately the same structure as the electromagnetic actuator 21 shown in FIGS. 8(a) through 8(c) and FIG. 16.

The same reference numerals are used for those portions of the electromagnetic actuators 21F, 21R shown in FIGS. 17(a) through 17(c) and FIG. 18 which are the same as the electromagnetic actuator 21 shown in FIGS. 8(a) through 8(c) and FIG. 16, and a detailed description thereof will be omitted.

As shown in FIGS. 17(a) through 17(c) and FIG. 18, the electromagnetic actuators 21F, 21R each comprise a displacement amplification mechanism 21A made of a magnetic material and having at least one displacement amplification point, e.g. two displacement amplification points L2x, L2y, and four coils (windings) 26a, 26b, 26c, 26d provided in the displacement amplification mechanism 21A and which generate a magnetic flux in the displacement amplification mechanism 21A. A magnetic flux is generated in the displacement amplification mechanism 21A made of a magnetic material by passing an electric current through the coils 26a, 26b, 26c, 26d. The magnetic flux acts to decrease the lengths of the gaps 25a, 25c, thereby displacing the displacement amplification points L2x, L2y.

The displacement amplification mechanism 21A may have one displacement amplification point, or two or more displacement amplification points.

The displacement amplification mechanism 21A of the electromagnetic actuator 21F. 21R will now be described. The displacement amplification mechanism 21A includes a pair of support iron cores 23a, 23b comprised of elastic members, a pair of movable iron cores 24a, 24b located on both sides of the pair of support iron cores 23a, 23b, a pair of attracting iron cores 22a, 22b extending inwardly from the support iron cores 23a, 23b and having two opposing surfaces which form the gap 25a, and a pair of attracting iron cores 22c, 22d extending inwardly from the support iron cores 23a, 23b and having two opposing surfaces which form the gap 25c.

The coils 26a, 26b, 26c, 26d are wound on the attracting iron cores 22a, 22b, 22c, 22d, respectively.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby displacing the displacement amplification points L2x, L2y outwardly (see FIG. 17(b)). By decreasing the electric current applied to the coils 26a, 26b, 26c, 26d, the original lengths of the gaps 25a, 25c are restored by the resilience of the displacement amplification mechanism 21A, whereby the displacement amplification points L2x, L2y are returned to the original positions (see FIG. 17(c)).

The movement mechanism 30 is comprised of the pair of electromagnetic actuators 21F, 21R having such a construction, and the expandable/contractible intermediate actuator 40 secured to the electromagnetic actuators 21F, 21R. As described above, the intermediate actuator 40 has the same construction as each of the electromagnetic actuators 21F, 21R.

Figure 19:
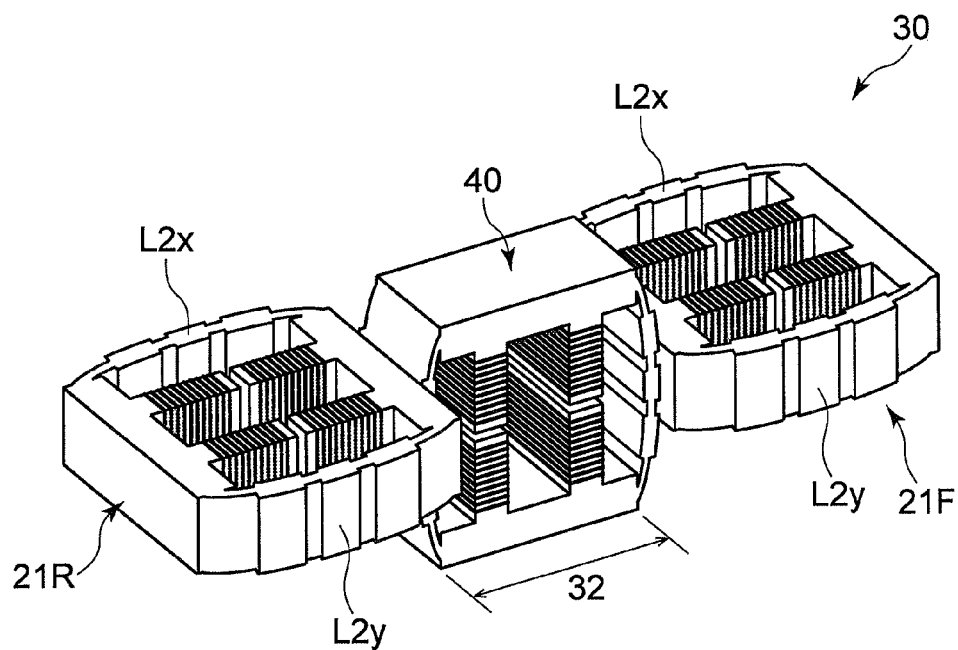
FIG. 19 is a diagram showing a movement mechanism according to an embodiment of the present invention.

As shown in FIG. 19, in each of the pair of electromagnetic actuators 21F, 21R of the movement mechanism 30, the displacement amplification points L2x, L2y face outward, and are displaced outwardly by passing an electric current through the coils 26a, 26b, 26c, 26d. On the other hand, the displacement amplification points L2x, L2y of the intermediate actuator 40 face the adjacent electromagnetic actuators 21F, 21R, and are displaced outwardly by passing an electric current through the coils 26a, 26b, 26c, 26d, thereby increasing the distance 32 between the pair of electromagnetic actuators 21F, 21R.

Figure 20A:
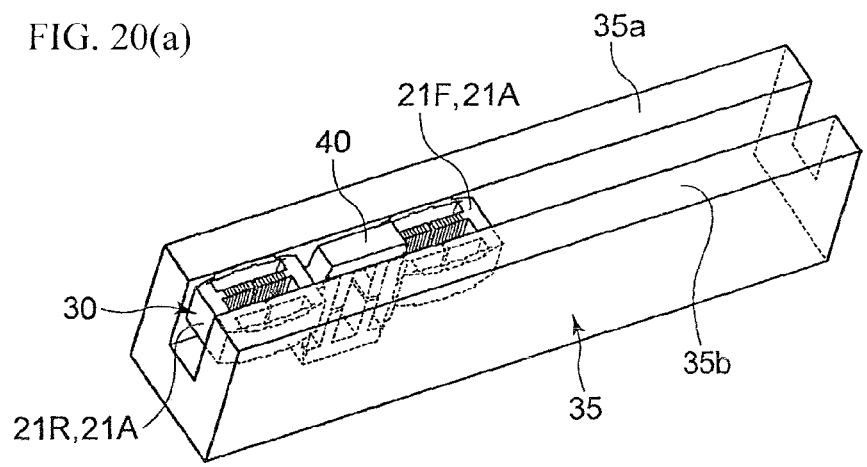
FIGS. 20(a) and 20(b) are diagrams showing the movement mechanism disposed inside a pair of rails.
Figure 20B:
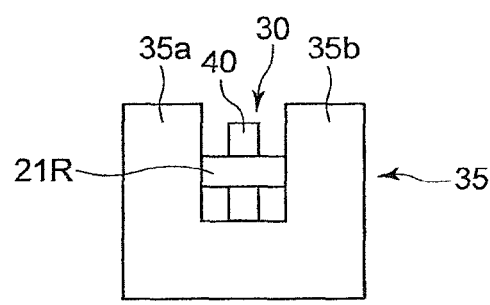

As shown in FIGS. 20(a) and 20(b), the flat-shaped displacement amplification mechanism 21A of each of the pair of electromagnetic actuators 21F, 21R of the movement mechanism 30 is held in a horizontal position in the pair of rails 35a, 35b of the guide 35, whereas the flat-shaped intermediate actuator 40, provided between the pair of electromagnetic actuators 21F, 21R, is held in a vertical position.

However, the position of the displacement amplification mechanism 21A of each of the pair of electromagnetic actuators 21F, 21R and the intermediate actuator 40 is not limited to the position shown in FIGS. 20(a) and 20(b). Thus, the pair of electromagnetic actuators 21F, 21R and the intermediate actuator 40 may all be held in a horizontal position.

As shown in FIGS. 20(a) and 20(b), by passing an electric current through the coils 26a, 26b, 26c, 26d of the pair of electromagnetic actuators 21F, 21R, the displacement amplification points L2x, L2y of each of the electromagnetic actuators 21F, 21R can be displaced outwardly, thereby bringing the electromagnetic actuators 21F, 21R into contact with the inner surfaces of the rails 35a, 35b. By stopping the application of electric current to the coils 26a, 26b, 26c, 26d of the electromagnetic actuators 21F, 21R, the displacement amplification points L2x, L2y can be displaced inwardly, thereby separating the electromagnetic actuators 21F, 21R from the inner surfaces of the rails 35a, 35b.

By passing an electric current through the coils 26a, 26b, 26c, 26d of the intermediate actuator 40, the displacement amplification points L2x, L2y of the intermediate actuator 40 can be displaced outwardly, thereby increasing the distance 32 between the pair of electromagnetic actuators 21F, 21R.

On the other hand, by stopping the application of electric current to the coils 26a, 26b, 26c, 26d of the intermediate actuator 40, the displacement amplification points L2x, L2y of the intermediate actuator 40 can be displaced inwardly, thereby decreasing the distance 32 between the pair of electromagnetic actuators 21F, 21R.

The operation of the movement mechanism 30 of this embodiment will now be described with reference to FIG. 21 and FIGS. 22(a) and 22(b).

Figure 21:
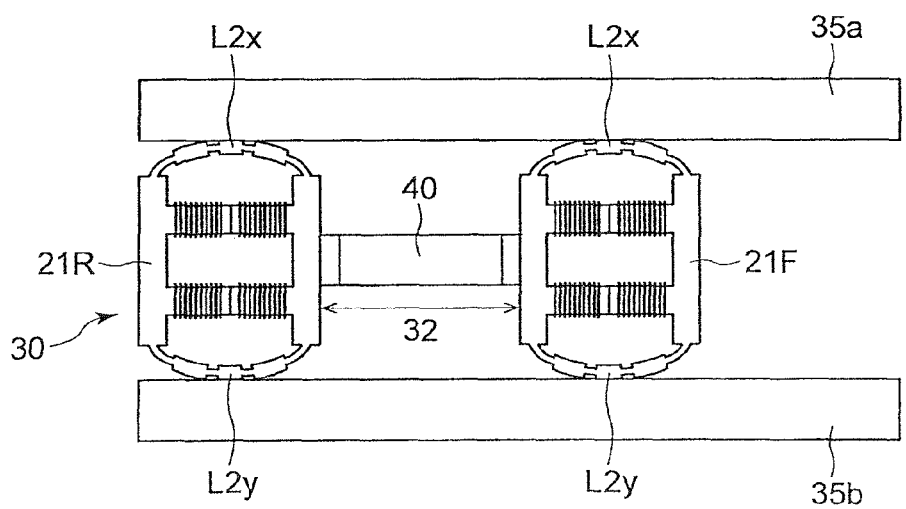
FIG. 21 is a diagram illustrating the operation of the movement mechanism disposed inside the pair of rails.
Figure 22A:
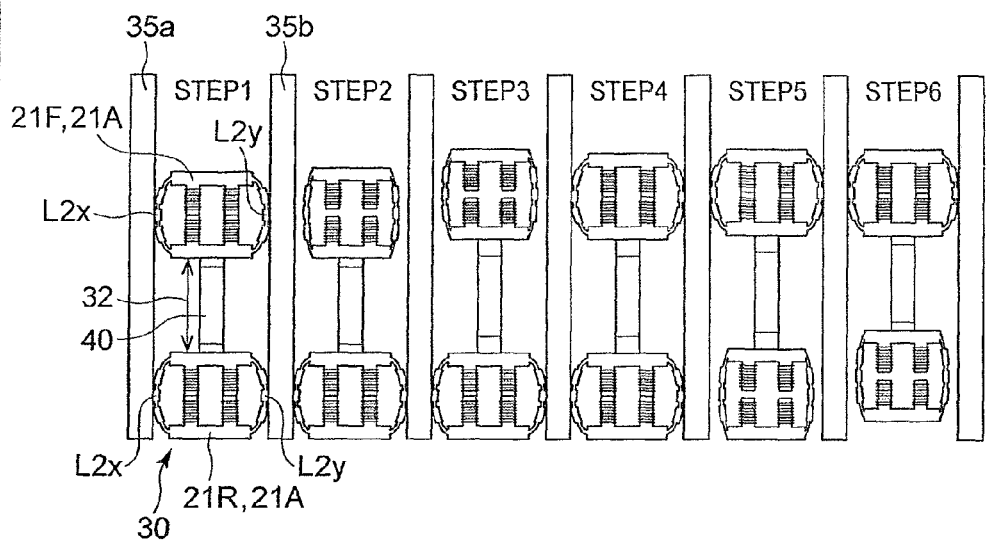
FIGS. 22(a) and 22(b) are diagrams illustrating the operation of the movement mechanism.
Figure 22B:
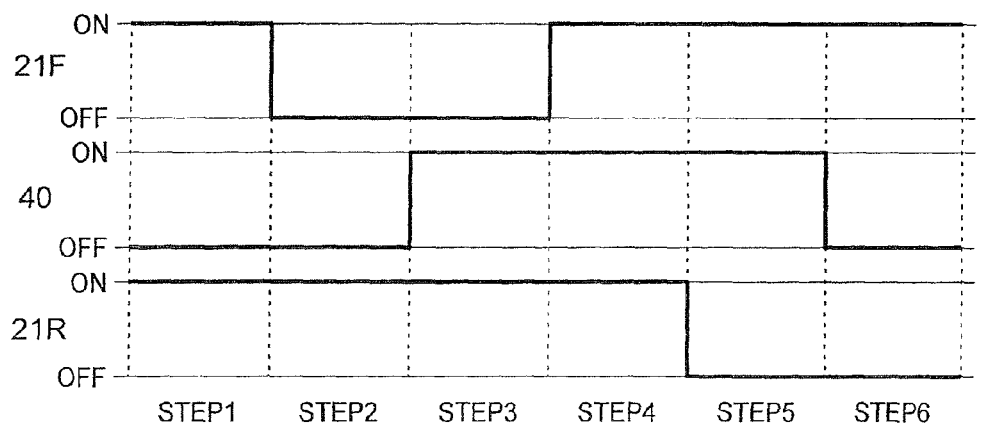

As shown in FIG. 21 and FIGS. 22(a) and 22(b), the movement mechanism 30 comprising the pair of electromagnetic actuators 21F, 21R and the intermediate actuator 40, provided between the pair of electromagnetic actuators 21F, 21R, is disposed inside the pair of rails 35a, 35b.

First, an electric current is applied to the pair of electromagnetic actuators 21F, 21R to outwardly displace the displacement amplification points L2x, L2y of each of the electromagnetic actuators 21F, 21R, thereby bringing the electromagnetic actuators 21F, 21R into contact with the inner surfaces of the pair of rails 35a, 35b. The electromagnetic actuators 21F. 21R are thus gripped by and fixed to the inner surfaces of the pair of rails 35a, 35b (step 1).

On the other hand, no electric current has yet been applied to the intermediate actuator 40: the displacement amplification points L2x, L2y are in contracted positions.

Next, the application of electric current to the electromagnetic actuator 21F is stopped to inwardly displace the displacement amplification points L2x, L2y of the electromagnetic actuator 21F, thereby separating the electromagnetic actuator 21F from the inner surfaces of the pair of rails 35a, 35b (step 2).

Next, an electric current is applied to the intermediate actuator 40 to outwardly displace the displacement amplification points L2x, L2y of the intermediate actuator 40, thereby increasing the distance 32 between the electromagnetic actuators 21F, 21R. Consequently, the electromagnetic actuator 21F advances upward in FIG. 22(a) (step 3).

Next, an electric current is applied to the electromagnetic actuator 21F to outwardly displace the displacement amplification points L2x, L2y of the electromagnetic actuator 21F, thereby bringing the electromagnetic actuator 21F into contact with the pair of rails 35a, 35b (step 4).

Next, the application of electric current to the electromagnetic actuator 21R is stopped to inwardly displace the displacement amplification points L2x, L2y of the electromagnetic actuator 21R, thereby separating the electromagnetic actuator 21R from the inner surfaces of the pair of rails 35a, 35b (step 5).

Next, the application of electric current to the intermediate actuator 40 is stopped to inwardly displace the displacement amplification points L2x, L2y of the intermediate actuator 40. Consequently, the electromagnetic actuator 21R advances toward the electromagnetic actuator 21F, and the distance 32 between the electromagnetic actuators 21F, 21R decreases (step 6).

In this manner, the movement mechanism 30 as a whole can be advanced upward in FIG. 22(a) inside the pair of rails 35a, 35b.

Alternatively, the movement mechanism 30 as a whole can be retreated downward in FIG. 22(a) inside the pair of rails 35a. 35b.

The electromagnetic actuators 21F, 21R of the movement mechanism 30, which come into contact with/separate from the pair of rails 35a, 35b, function as a gripper mechanism to be gripped by the pair of rails 35a, 35b.

<Second Embodiment of Movement Mechanism>

A second embodiment of the instant movement mechanism will now be described with reference to FIGS. 25(a) and 25(b).

Figure 25A:
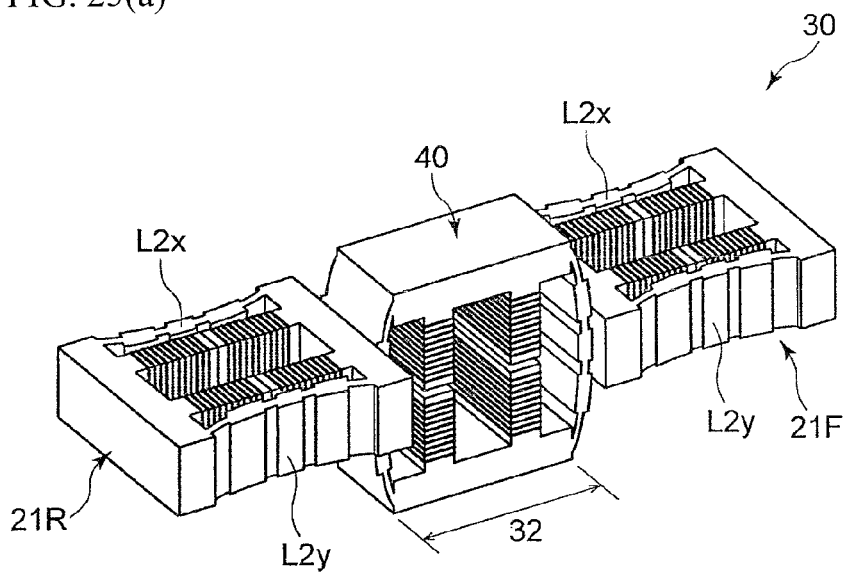
FIGS. 25(a) and 25(b) are diagrams showing a gripper mechanism and a movement mechanism according to an embodiment of the present invention.
Figure 25B:
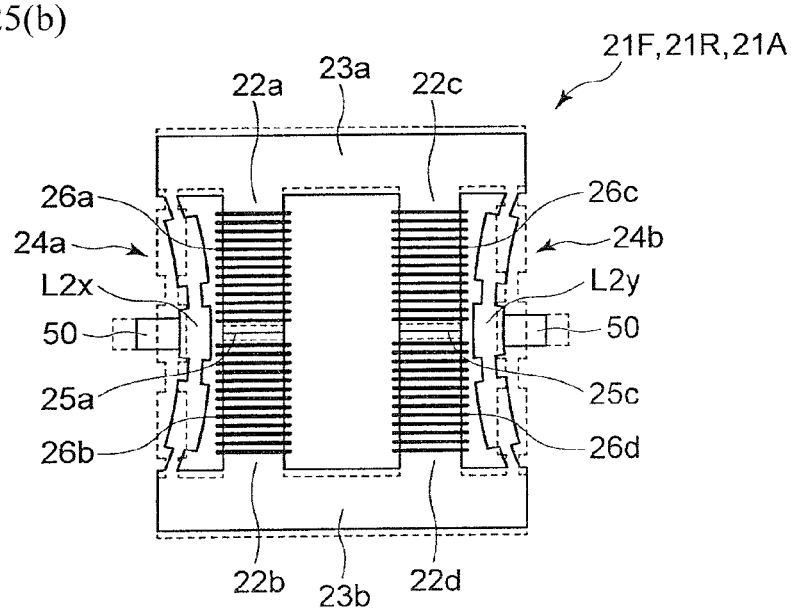

In the second embodiment illustrated in FIGS. 25(a) and 25(b), the movement mechanism 30 comprises a pair of electromagnetic actuators 21F, 21R, and an intermediate actuator 40 provided in the pair of electromagnetic actuators 21F, 21R. The electromagnetic actuators 21F, 21R and the intermediate actuator 40 have the same structure and each include a displacement amplification mechanism 21A having two displacement amplification points L2x, L2y, and coils 26a, 26b, 26c, 26d provided in the displacement amplification mechanism 21A.

A magnetic flux is generated in the displacement amplification mechanism 21A made of a magnetic material by passing an electric current through the coils 26a, 26b, 26c, 26d. The magnetic flux acts to decrease the lengths of the gaps 25a, 25c, thereby displacing the displacement amplification points L2x, L2y.

The displacement amplification mechanism 21A will now be described. The displacement amplification mechanism 21A includes a pair of support iron cores 23a, 23b comprised of elastic members, a pair of movable iron cores 24a, 24b located on both sides of the pair of support iron cores 23a, 23b, a pair of attracting iron cores 22a, 22b extending inwardly from the support iron cores 23a, 23b and having two opposing surfaces which form the gap 25a, and a pair of attracting iron cores 22c, 22d extending inwardly from the support iron cores 23a, 23b and having two opposing surfaces which form the gap 25c.

The coils 26a, 26b, 26c, 26d are wound on the attracting iron cores 22a, 22b, 22c, 22d, respectively. The pair of movable iron cores 24a, 24b of the displacement amplification mechanism 21A are slightly curved inward.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby displacing the displacement amplification points L2x, L2y inwardly. By decreasing the electric current applied to the coils 26a, 26b, 26c, 26d, the original lengths of the gaps 25a, 25c are restored by the resilience of the displacement amplification mechanism 21A, whereby the displacement amplification points L2x, L2y are returned to the original positions.

As described above, in the embodiment illustrated in FIGS. 25(a) and 25(b), the two displacement amplification points L2x, L2y of each of the electromagnetic actuators 21F, 21R and the intermediate actuator 40, constituting the movement mechanism 30, are displaced inwardly by passing an electric current through the coils, and displaced outwardly and returned to the original positions by decreasing the electric current.

Thus, as shown in FIGS. 25(a) and 25(b), the distance between the displacement amplification points L2x, L2y of each of the electromagnetic actuators 21F, 21R and the intermediate actuator 40 can be increased by decreasing or stopping the electric current. Therefore, when fixing the electromagnetic actuators 21F, 21R to the rails 35a, 35b, the electric current is decreased or stopped to outwardly displace the displacement amplification points L2x, L2y and bring projecting portions 50 into contact with the inner surfaces of the rails 35a, 35b. The electromagnetic actuators 21F, 21R can thus be fixed to the rails 35a, 35b stably at a low cost.

In the above-described embodiments the intermediate actuator 40 has the same structure as each of the pair of electromagnetic actuators 21F, 21R. However, the intermediate actuator 40 may be comprised of a piezoelectric actuator, a magnetostrictive actuator, or other small displacement actuator.

<Third Embodiment of Movement Mechanism>

A third embodiment of the instant movement mechanism will now be described with reference to FIGS. 26(a) and 26(b), FIGS. 27(a) and 27(b), and FIGS. 28(a) and 28(b).

As shown in FIGS. 26(a) and 26(b), FIGS. 27(a) and 27(b), and FIGS. 28(a) and 28(b), the movement mechanism 30 using an electromagnetic actuator is mounted on the periphery of a transport guide 35 including a guide rod 37. The movement mechanism 30 comprises a pair of electromagnetic actuators 21F, 21R provided on the guide rod 37, and an intermediate actuator 40 which is disposed between and secured to the electromagnetic actuators 21F. 21R and which expands/contracts in the transport direction of the guide 35.

The electromagnetic actuator 21F is a front electromagnetic actuator, and the electromagnetic actuator 21R is a rear electromagnetic actuator.

The electromagnetic actuators 21F, 21R will now be described with reference to FIGS. 26(a) and 26(b) and FIGS. 27(a) and 27(b).

The electromagnetic actuators 21F, 21R shown in FIGS. 26(a) and 26(b) and FIGS. 27(a) and 27(b) each have openings 39 through which the guide rod 37 penetrates, and are mounted on the periphery of the guide rod 37. The electromagnetic actuators 21F, 21R each comprise a displacement amplification mechanism 21A made of a magnetic material and having at least one displacement amplification point, e.g. two displacement amplification points L2x, L2y, and four coils (windings) 26a, 26b, 26c, 26d provided in the displacement amplification mechanism 21A and which generate a magnetic flux in the displacement amplification mechanism 21A. A magnetic flux is generated in the displacement amplification mechanism 21A made of a magnetic material by passing an electric current through the coils 26a, 26b, 26c, 26d. The magnetic flux acts to decrease the lengths of the gaps 25a, 25c, thereby displacing the displacement amplification points L2x, L2y (FIGS. 27(a) and 27(b)).

The displacement amplification mechanism 21A may have one displacement amplification point, or two or more displacement amplification points.

The displacement amplification mechanism 21A of the electromagnetic actuator 21F, 21R will now be described with reference to FIGS. 27(a) and 27(b). The displacement amplification mechanism 21A includes a pair of support iron cores 23a, 23b comprised of elastic members, a pair of opposing movable iron cores 24a, 24b located on both sides of the pair of support iron cores 23a, 23b, a pair of attracting iron cores 22a, 22b disposed in a 90-degree rotation position with respect to the support iron cores 23a, 23b and having two opposing surfaces which form the gap 25a, and a pair of attracting iron cores 22c, 22d disposed in a 90-degree rotation position with respect to the support iron cores 23a, 23b and having two opposing surfaces which form the gap 25c.

The coils 26a, 26b, 26c, 26d are wound on the attracting iron cores 22a, 22b, 22c, 22d, respectively.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby displacing the displacement amplification points L2x, L2y inwardly (see FIG. 27(b)). By decreasing the electric current applied to the coils 26a, 26b, 26c, 26d, the original lengths of the gaps 25a, 25c are restored by the resilience of the displacement amplification mechanism 21A, whereby the displacement amplification points L2x, L2y are returned to the original positions (see FIG. 27(a)).

FIGS. 27(a) and 27(b) show the electromagnetic actuator 21F, 21R from the side of the pair of attracting iron cores 22a, 22b that form the gap 25a. Thus, only the pair of attracting iron cores 22a, 22b and the coils 26a, 26b wound on the iron cores 22a, 22b are shown in FIGS. 27(a) and 27(b), while the other pair of attracting iron cores 22c, 22d that form the gap 25c and the coils 26c, 26d wound on the iron cores 22c, 22d are not shown.

The intermediate actuator 40 has the same construction as each of the electromagnetic actuators 21F, 21R shown in FIGS. 17(a) through 17(c).

The movement mechanism 30 is comprised of the pair of electromagnetic actuators 21F, 21R having such a construction, and the expandable/contractible intermediate actuator 40 secured to the electromagnetic actuators 21F, 21R.

As shown in FIGS. 27(a) and 27(b), in each of the pair of electromagnetic actuators 21F, 21R of the movement mechanism 30, the displacement amplification points L2x. L2y face inward, and are displaced inwardly by passing an electric current through the coils 26a, 26b, 26c, 26d. On the other hand, the displacement amplification points L2x. L2y of the intermediate actuator 40 face the adjacent electromagnetic actuators 21F, 21R, and are displaced outwardly by passing an electric current through the coils 26a, 26b, 26c, 26d, thereby increasing the distance 32 between the pair of electromagnetic actuators 21F, 21R.

As shown in FIGS. 26(a) and 26(b) and FIGS. 27(a) and 27(b), the pair of electromagnetic actuators 21F, 21R are mounted on the periphery of the guide rod 37. The intermediate actuator 40 lies outside the guide rod 37 and is secured to the pair of electromagnetic actuators 21F, 21R.

As shown in FIGS. 27(a) and 27(b), by passing an electric current through the coils 26a, 26b, 26c, 26d of the pair of electromagnetic actuator 21F, 21R, the displacement amplification points L2x, L2y of the electromagnetic actuator 21F, 21R can be displaced inwardly, thereby bringing the electromagnetic actuator 21F, 21R into contact with the periphery of the guide rod 37. By stopping the application of electric current to the coils 26a, 26b, 26c, 26d of the electromagnetic actuator 21F, 21R, the displacement amplification points L2x, L2y can be displaced outwardly, thereby separating the electromagnetic actuator 21F, 21R from the periphery of the guide rod 37.

By passing an electric current through the coils 26a, 26b, 26c, 26d of the intermediate actuator 40, the displacement amplification points L2x, L2y of the intermediate actuator 40 can be displaced outwardly, thereby increasing the distance 32 between the pair of electromagnetic actuators 21F, 21R.

On the other hand, by stopping the application of electric current to the coils 26a, 26b, 26c, 26d of the intermediate actuator 40, the displacement amplification points L2x, L2y of the intermediate actuator 40 can be displaced inwardly, thereby decreasing the distance 32 between the pair of electromagnetic actuators 21F, 21R.

The operation of the movement mechanism 30 of this embodiment will now be described with reference to FIGS. 26(a) and 26(b), FIGS. 27(a) and 27(b), and FIGS. 28(a) and 28(b).

As shown in FIGS. 26(a) and 26(b), FIGS. 27(a) and 27(b), and FIGS. 28(a) and 28(b), the movement mechanism 30 comprising the pair of electromagnetic actuators 21F, 21R and the intermediate actuator 40, provided between the pair of electromagnetic actuators 21F, 21R, is mounted on the guide rod 37.

First, as shown in FIG. 27(b), an electric current is applied to the pair of electromagnetic actuators 21F, 21R to inwardly displace the displacement amplification points L2x, L2y of each of the electromagnetic actuators 21F, 21R, thereby bringing the electromagnetic actuators 21F, 21R into contact with the periphery of the guide rod 37. The electromagnetic actuators 21F, 21R thus grip and are fixed to the periphery of the guide rod 37 (step 1).

On the other hand, no electric current has yet been applied to the intermediate actuator 40: the displacement amplification points L2x, L2y are in contracted positions.

Next, as shown in FIG. 27(a), the application of electric current to the electromagnetic actuator 21F is stopped to outwardly displace the displacement amplification points L2x, L2y of the electromagnetic actuator 21F, thereby separating the electromagnetic actuator 21F from the periphery of the guide rod 37 (step 2).

Next, an electric current is applied to the intermediate actuator 40 to outwardly displace the displacement amplification points L2x, L2y of the intermediate actuator 40, thereby increasing the distance 32 between the electromagnetic actuators 21F, 21R. Consequently, the electromagnetic actuator 21F advances upward in FIG. 28(a) (step 3).

Next, as shown in FIG. 27(b), an electric current is applied to the electromagnetic actuator 21F to inwardly displace the displacement amplification points L2x, L2y of the electromagnetic actuator 21F, thereby bringing the electromagnetic actuator 21F into contact with the periphery of the guide rod 37 (step 4).

Next, as shown in FIG. 27(a), the application of electric current to the electromagnetic actuator 21R is stopped to outwardly displace the displacement amplification points L2x, L2y of the electromagnetic actuator 21R, thereby separating the electromagnetic actuator 21R from the periphery of the guide rod 37 (step 5).

Next, the application of electric current to the intermediate actuator 40 is stopped to inwardly displace the displacement amplification points L2x, L2y of the intermediate actuator 40. Consequently, the electromagnetic actuator 21R advances toward the electromagnetic actuator 21F, and the distance 32 between the electromagnetic actuators 21F, 21R decreases (step 6).

Figure 28A:
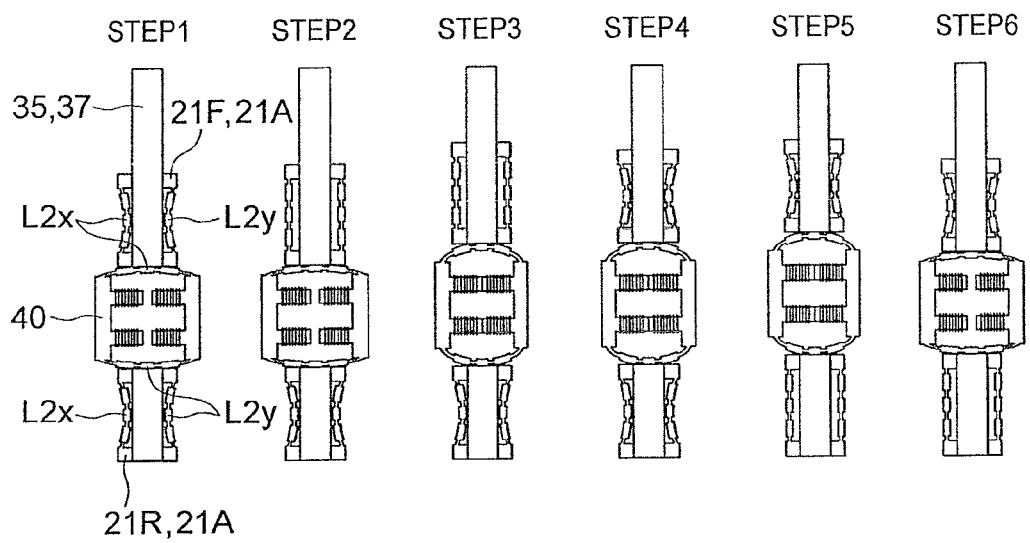
FIGS. 28(a) and 28(b) are diagrams illustrating the operation of a movement mechanism.
Figure 28B:
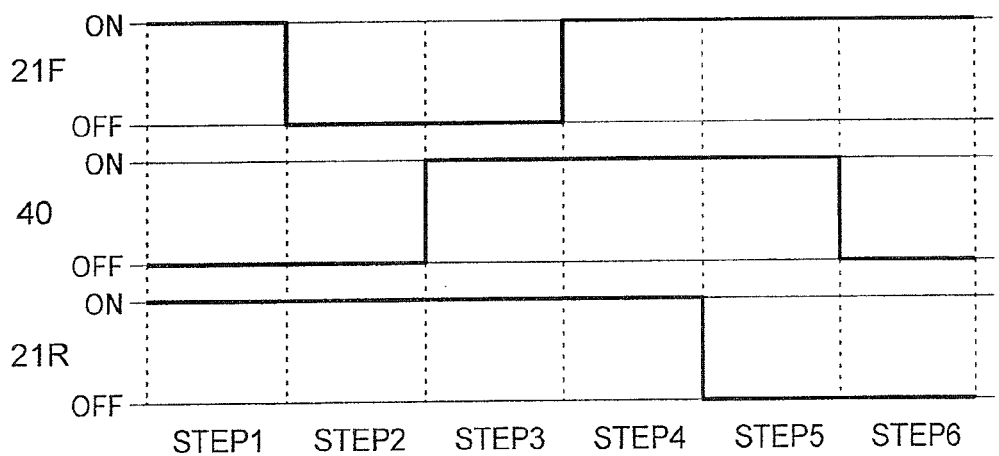
Figure 29:
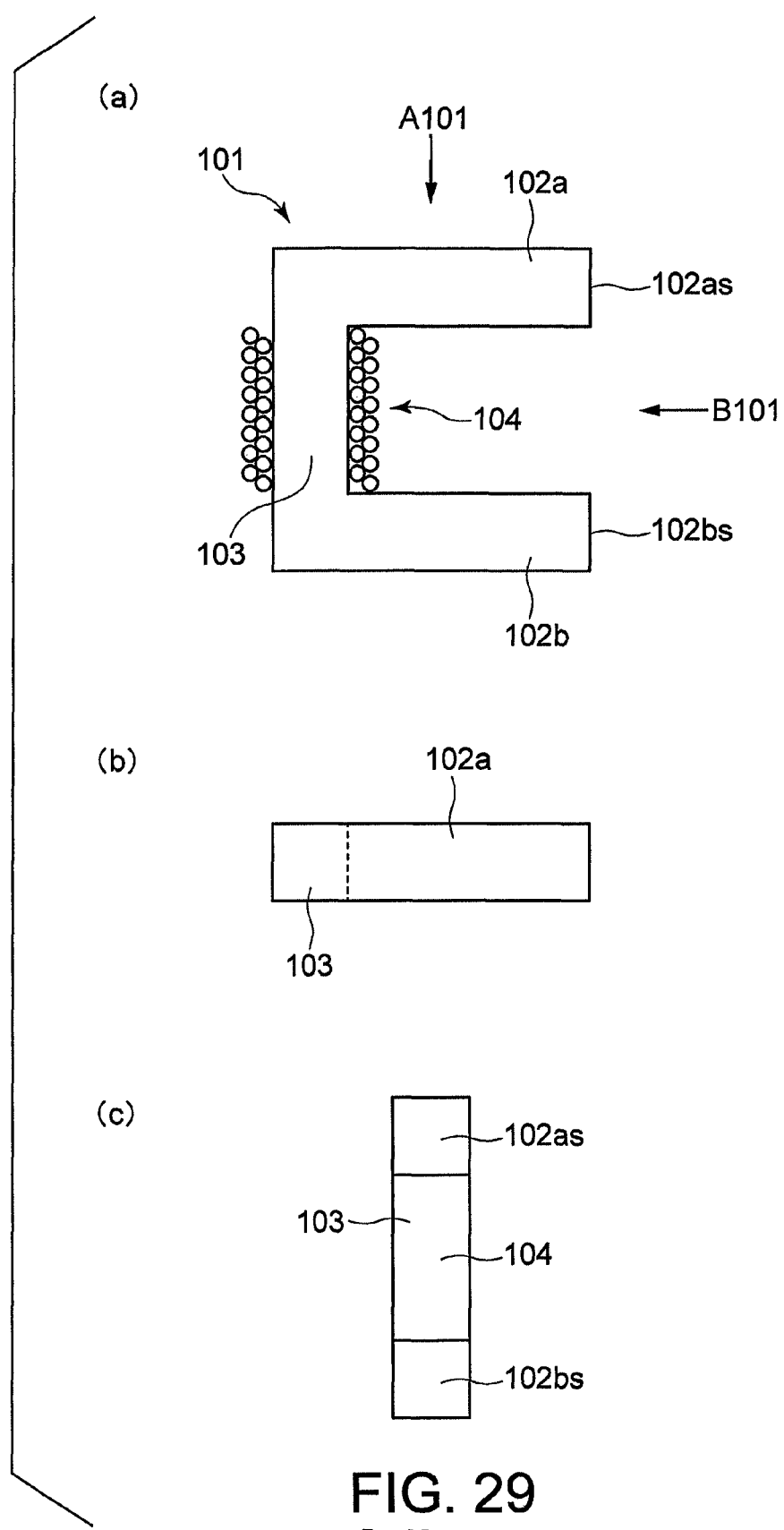
FIGS. 29(a) through 29(c) are diagrams showing a prior-art electromagnetic attraction force generation mechanism.
Figure 30:
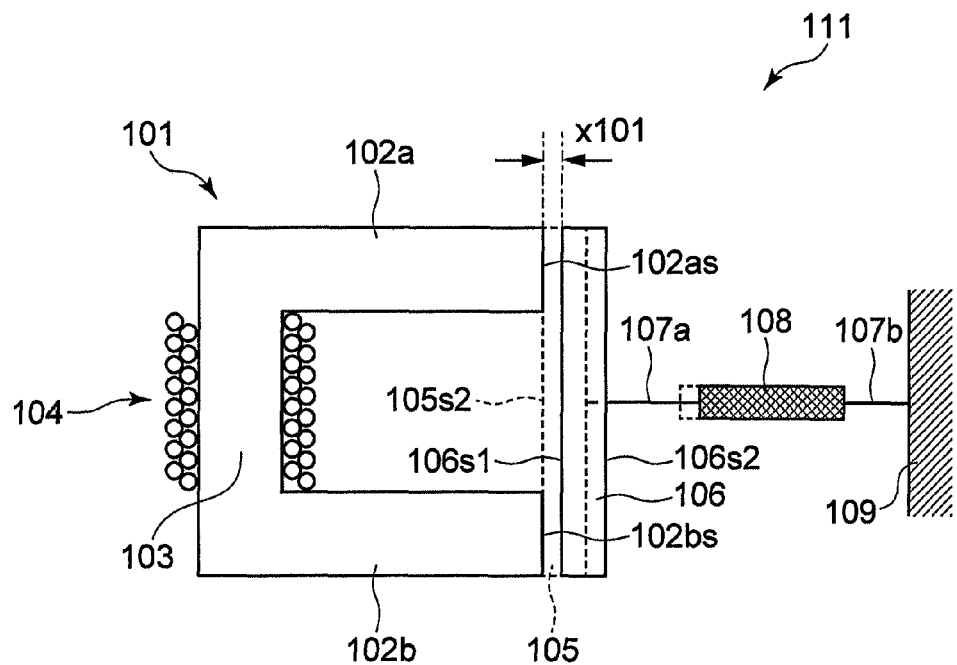
FIG. 30 is a diagram showing a prior-art electromagnetic actuator.
Figure 31:
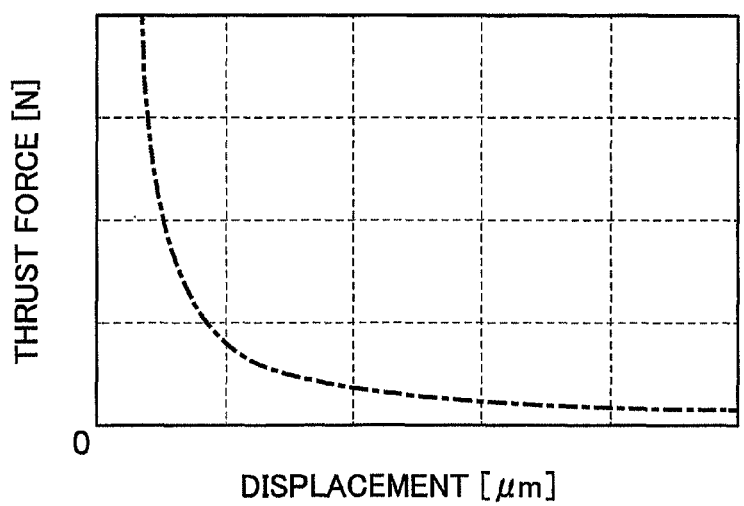
FIG. 31 is a graph showing the relationship between displacement and thrust force in the prior-art electromagnetic actuator.

In this manner, the movement mechanism 30 as a whole can be advanced upward in FIG. 28(a) along the guide rod 37.

Alternatively, the movement mechanism 30 as a whole can be retreated downward in FIG. 28(a) along the guide rod 37.

The electromagnetic actuators 21F, 21R of the movement mechanism 30, which come into contact with/separate from the guide rod 37, function as a gripper mechanism to grip the guide rod 37.

In the above-described embodiment the electromagnetic actuators 21F, 21R are brought into contact with the periphery of the guide rod 37 by applying an electric current to the electromagnetic actuators 21F. 21R. However, it is also possible to separate the electromagnetic actuators 21F, 21R from the periphery of the guide rod 37 by applying an electric current to the electromagnetic actuators 21F, 21R, and to bring the electromagnetic actuators 21F, 21R into contact with the periphery of the guide rod 37 by stopping the application of electric current to the electromagnetic actuators 21F, 21R.

In the above-described embodiment the intermediate actuator 40 has the same structure as each of the pair of electromagnetic actuators 21F, 21R. However, the intermediate actuator 40 may be comprised of a piezoelectric actuator, a magnetostrictive actuator, or other small displacement actuator.

<Fourth Embodiment of Movement Mechanism>

A fourth embodiment of the instant movement mechanism will now be described with reference to FIGS. 33(a) and 33(b).

The fourth embodiment of the instant movement mechanism, shown in FIGS. 33(a) and 33(b), is the same as the third embodiment of the instant movement mechanism shown in FIGS. 26(a) and 26(b), FIGS. 27(a) and 27(b), and FIGS. 28(a) and 28(b) except that the electromagnetic actuators 21F, 21R shown in FIGS. 33(a) and 33(b) are used in the fourth embodiment.

In the embodiment illustrated in FIGS. 33(a) and 33(b), the movement mechanism 30 comprises a pair of electromagnetic actuators 21F, 21R, and an intermediate actuator 40 provided in the pair of electromagnetic actuators 21F, 21R. The electromagnetic actuators 21F, 21R each comprise a displacement amplification mechanism 21A having at least one displacement amplification point, e.g. two displacement amplification points L2x, L2y, and coils 26a, 26b, 26c, 26d provided in the displacement amplification mechanism 21A.

A magnetic flux is generated in the displacement amplification mechanism 21A made of a magnetic material by passing an electric current through the coils 26a, 26b, 26c.

26d. The magnetic flux acts to decrease the lengths of the gaps 25a, 25c, thereby displacing the displacement amplification points L2x, L2y.

The displacement amplification mechanism 21A will now be described. The displacement amplification mechanism 21A includes a pair of support iron cores 23a, 23b comprised of elastic members, a pair of movable iron cores 24a, 24b located on both sides of the pair of support iron cores 23a, 23b, a pair of attracting iron cores 22a, 22b extending inwardly from the support iron cores 23a, 23b and having two opposing surfaces which form the gap 25a, and a pair of attracting iron cores 22c, 22d extending inwardly from the support iron cores 23a, 23b and having two opposing surfaces which form the gap 25c.

The coils 26a, 26b, 26c, 26d are wound on the attracting iron cores 22a, 22b, 22c, 22d, respectively. The pair of movable iron cores 24a, 24b of the displacement amplification mechanism 21A are slightly curved outward.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby displacing the displacement amplification points L2x, L2y outwardly. By decreasing the electric current applied to the coils 26a, 26b. 26c, 26d, the original lengths of the gaps 25a, 25c are restored by the resilience of the displacement amplification mechanism 21A, whereby the displacement amplification points L2x, L2y are returned to the original positions.

As described above, in the embodiment illustrated in FIGS. 33(a) and 33(b), the two displacement amplification points L2x, L2y of each of the electromagnetic actuators 21F, 21R, constituting the movement mechanism 30, are displaced outwardly by passing an electric current through the coils, and displaced inwardly and returned to the original positions by decreasing the electric current.

Thus, as shown in FIG. 33(a), the distance between the displacement amplification points L2x, L2y of the electromagnetic actuator 21F, 21R can be decreased by decreasing or stopping the electric current. Therefore, when fixing the electromagnetic actuator 21F. 21R to the periphery of the guide rod 37, the electric current is decreased or stopped to inwardly displace the displacement amplification points L2x, L2y and bring projecting portions 50 into contact with the periphery of the guide rod 37. The electromagnetic actuator 21F, 21R can thus be fixed to the guide rod 37 stably at a low cost.

By passing an electric current through the coils 26a, 26b, 26c, 26d, a magnetic flux is generated in the displacement amplification mechanism 21A of the electromagnetic actuator 21F, 21R to cause a change in the lengths of the gaps 25a, 25c, thereby outwardly displacing the displacement amplification points L2x, L2y (see FIG. 33(b)).

EXAMPLE

A specific example according to the present invention will now be described with reference to FIGS. 23 and 24.

The example corresponds to the gripper mechanisms and the movement mechanism shown in FIGS. 17 through 22.

<Drive Test for Movement Mechanism 30>

1. Test Model

A test model was produced using SUS304 in the displacement amplification mechanism and a 20-layer stack of magnetic steel sheets (50H270 manufactured by Nippon Steel) in the core portion because of the high magnetic properties, such as saturation magnetic flux density, of the steel sheets. The 20-layer stack (20×0.5 mm) of magnetic steel sheets was fixed with an adhesive and was subjected to wire electric discharge machining. In assembling of the test model, a 50-μm thick shim was put in the connecting portion between adjacent steel sheets so as to make the gap of each connecting portion about 50 μm. Four 25-turn coils, connected in series, were disposed in the displacement amplification mechanism. The shape of the displacement amplification mechanism had been designed by the finite element method using ANSYS so that the amplification ratio of the output displacement on one side to a change in the gap becomes about 4. Three such electromagnetic actuators having the same shape were combined to produce an inchworm-type movement mechanism.

2. Test Method

The test model was set in a U-shaped rail (groove width 22.3 mm, rail length 160 mm) made of SUS304, and was subjected to drive test. In the drive test, displacement of the rear surface of the inchworm-type movement mechanism was measured with a laser displacement meter (LC2440 manufactured by Keyence Corporation). An electric current was applied to the movement mechanism by means of a bipolar power source (BPS120-5 manufactured by Takasago Ltd.) while controlling the electric current according to the sequence shown in FIGS. 22(*a*) and 22(*b*) by using a digital signal processor (DS1104 R&D Controller Board manufactured by dSPACE). The electric current was inputted to the electromagnetic actuators in a stepwise manner with a width of 1.5 A, the switching duration between steps being 2, 5, 50, 100 ms, to drive the movement mechanism in a front-back direction.

3. Test Results

Figure 23:
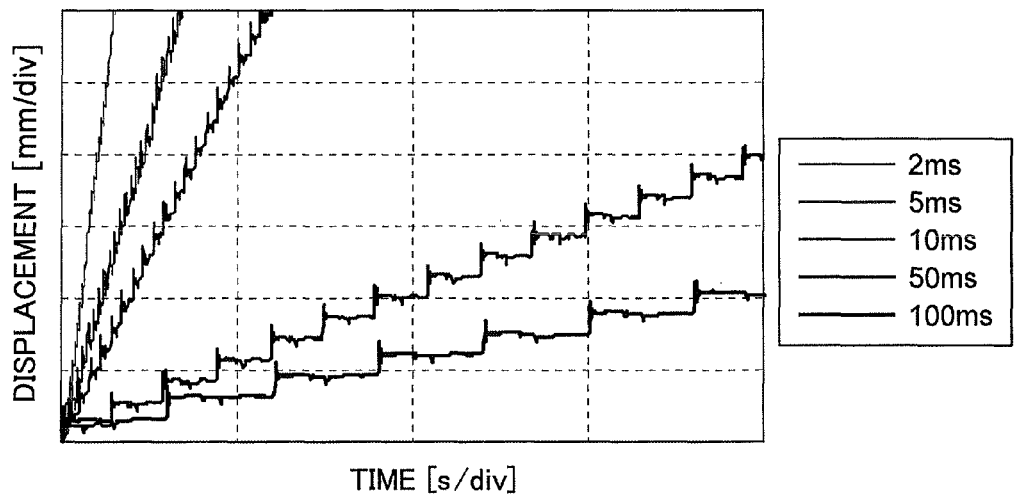
FIG. 23 is a diagram showing test results obtained in the Example.
Figure 24:
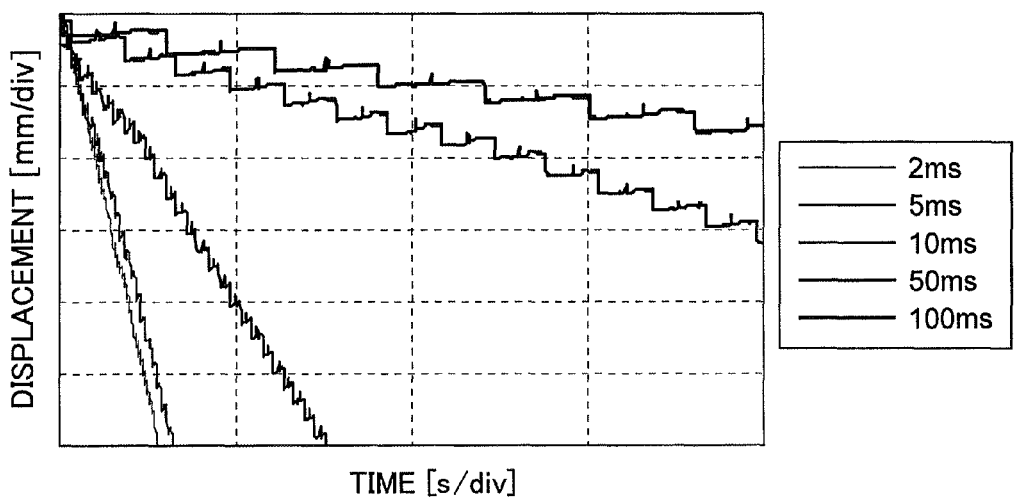
FIG. 24 is a diagram showing test results obtained in the Example.

The test results are shown in FIGS. 23 and 24. The results verify that the inchworm-type movement mechanism according to the proposed principle is workable. The test data also indicates that, in the range tested, the movement speed increases with increase in the duration between steps. When the duration between steps was 2 ms (one cycle 12 ms), the movement speed was about 25 mm/s in the direction of forward movement, and about 20 mm/s in the direction of backward movement. When the step size was 100 ms, the amount of movement per cycle was about 390 μm in the forward direction (see FIG. 23) and about 270 μm in the backward direction (see FIG. 24) for all the durations between steps. The difference in the amount of movement between the forward direction and the backward direction is due to production error.

4. Conclusion

With respect to the proposed inchworm-type movement mechanism using a displacement amplification mechanism-integrated actuator, the drive principle and the results of the drive test performed on the test model have been described. The drive test has verified that the movement mechanism based on the proposed concept is workable. The movement speed of 25 mm/s was achieved in the drive test.

DESCRIPTION OF THE REFERENCE NUMERALS

1, 21, 21F, 21R electromagnetic actuator
1A, 21A displacement amplification mechanism
2*a*. 2*b*, 22*a*, 22*b*. 22*c*, 22*d* attracting iron core
3*a*, 3*b*, 23*a*, 23*b* support iron core
4*a*, 4*b*, 24*a*, 24*b* movable iron core
24*an*1, 24*an*2, 24*an*3, 24*an*4 movable iron core thin portion
24*bn*1, 24*bn*2, 24*bn*3, 24*bn*4 movable iron core thin portion
24*aw*1, 24*aw*2, 24*aw*3 movable iron core thick portion
24*bw*1, 24*bw*2, 24*bw*3 movable iron core thick portion
5, 25*a*, 25*b* gap
6, 26*a*, 26*b*, 26*c*, 26*d* windings
30 movement mechanism
32 distance
35 guide
35*a*, 35*b* rail
37 guide rod
L2*x*, L2*y* displacement amplification point

What is claimed is:

1. A gripper mechanism comprising:
an electromagnetic actuator provided in a guide, said electromagnetic actuator comprising a displacement amplification mechanism including a magnetic body having at least one displacement amplification point and a thrust generating portion, and a coil, provided in the displacement amplification mechanism, for generating a magnetic flux in the magnetic body,
wherein a magnetic flux is generated in the magnetic body by passing an electric current through the coil, thereby generating a thrust force in the thrust generating portion, and the displacement amplification point is displaced by the thrust force so that the displacement amplification point is brought into contact with or separated from the guide;
wherein the guide at least has opposing inner surfaces and the electromagnetic actuator is disposed between the inner surfaces of the guide, and wherein the displacement amplification point of the electromagnetic actuator comes into contact with or separates from the inner surfaces.

2. The gripper mechanism according to claim 1, wherein the electromagnetic actuator has at least two displacement amplification points disposed at opposing positions in the displacement amplification mechanism.

3. The gripper mechanism according to claim 2, wherein the guide has at least one guide rod and the electromagnetic actuator is mounted on the periphery of the guide rod, and wherein the displacement amplification point or points of the electromagnetic actuator come into contact with or separate from the periphery of the guide rod.

4. The gripper mechanism according to claim 1, wherein the guide has at least one guide rod and the electromagnetic actuator is mounted on the periphery of the guide rod, and wherein the displacement amplification point or points of the electromagnetic actuator come into contact with or separate from the periphery of the guide rod.

5. A movement mechanism comprising;
a pair of electromagnetic actuators provided in a guide, and an intermediate actuator which is secured to the pair of electromagnetic actuators and which expands/contracts along the guide, said electromagnetic actuators each comprising a displacement amplification mechanism including a magnetic body having at least one displacement amplification point and a thrust generating portion, and a coil, provided in the displacement amplification mechanism, for generating a magnetic flux in the magnetic body,
wherein a magnetic flux is generated in the magnetic body by passing an electric current through the coil, thereby generating a thrust force in the thrust generating portion, and the displacement amplification point is displaced by the thrust force so that the displacement amplification point is brought into contact with or separated from the guide,
wherein the guide at least has opposing inner surfaces and the electromagnetic actuators are disposed between the inner surfaces of the guide, and wherein the displacement amplification point of the electromagnetic actuator comes into contact with or separates from the inner surfaces.

6. The movement mechanism according to claim 5, wherein each electromagnetic actuator has at least two displacement amplification points disposed at opposing positions in the displacement amplification mechanism.

7. The movement mechanism according to claim 6, wherein the guide has at least one guide rod and the electromagnetic actuators are mounted on the periphery of the guide rod, and wherein the displacement amplification point or points of each electromagnetic actuator come into contact with or separate from the periphery of the guide rod.

8. The movement mechanism according to claim 6, wherein the intermediate actuator has the same structure as each of the electromagnetic actuators.

9. The movement mechanism according to claim 6, wherein the intermediate actuator is a small displacement actuator including a piezoelectric actuator or a magnetostrictive actuator.

10. The movement mechanism according to claim 5, wherein the guide has at least one guide rod and the electromagnetic actuators are mounted on the periphery of the guide rod, and wherein the displacement amplification point or points of each electromagnetic actuator come into contact with or separate from the periphery of the guide rod.

11. The movement mechanism according to claim 10, wherein the intermediate actuator has the same structure as each of the electromagnetic actuators.

12. The movement mechanism according to claim 5, wherein the intermediate actuator has the same structure as each of the electromagnetic actuators.

13. The movement mechanism according to claim 5, wherein the intermediate actuator is a small displacement actuator including a piezoelectric actuator or a magnetostrictive actuator.

* * * * *